US010480064B2

(12) United States Patent
Longrie et al.

(10) Patent No.: US 10,480,064 B2
(45) Date of Patent: *Nov. 19, 2019

(54) REACTION CHAMBER PASSIVATION AND SELECTIVE DEPOSITION OF METALLIC FILMS

(71) Applicant: ASM IP Holding B.V., Almere (NL)

(72) Inventors: Delphine Longrie, Ghent (BE); Antti Juhani Niskanen, Helsinki (FI); Han Wang, Leuven (BE); Qi Xie, Leuven (BE); Jan Willem Maes, Wilrijk (BE); Shang Chen, Tokyo (JP); Toshiharu Watarai, Tokyo (JP); Takahiro Onuma, Tokyo (JP); Dai Ishikawa, Tokyo (JP); Kunitoshi Namba, Tokyo (JP)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/040,844

(22) Filed: Jul. 20, 2018

(65) Prior Publication Data
US 2019/0055643 A1  Feb. 21, 2019

Related U.S. Application Data

(63) Continuation of application No. 15/795,768, filed on Oct. 27, 2017, now Pat. No. 10,041,166, which is a (Continued)

(51) Int. Cl.
*C23C 16/02* (2006.01)
*C23C 16/455* (2006.01)
(Continued)

(52) U.S. Cl.
CPC .............. *C23C 16/02* (2013.01); *C23C 16/06* (2013.01); *C23C 16/345* (2013.01);
(Continued)

(58) Field of Classification Search
CPC combination set(s) only.
See application file for complete search history.

(56) References Cited

U.S. PATENT DOCUMENTS

| | | |
|---|---|---|
| 4,804,640 A | 2/1989 | Kaganowicz |
| 4,863,879 A | 9/1989 | Kwok |

(Continued)

FOREIGN PATENT DOCUMENTS

| | | |
|---|---|---|
| EP | 0469456 A1 | 2/1992 |
| EP | 0880168 A2 | 11/1998 |

(Continued)

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

(Continued)

*Primary Examiner* — Ratisha Mehta
(74) *Attorney, Agent, or Firm* — Knobbe, Martens, Olson & Bear LLP

(57) ABSTRACT

Metallic layers can be selectively deposited on one surface of a substrate relative to a second surface of the substrate. In some embodiments, the metallic layers are selectively deposited on a first metallic surface relative to a second surface comprising silicon. In some embodiments the reaction chamber in which the selective deposition occurs may optionally be passivated prior to carrying out the selective deposition process. In some embodiments selectivity of above about 50% or even about 90% is achieved.

20 Claims, 4 Drawing Sheets

Related U.S. Application Data continuation of application No. 15/177,195, filed on Jun. 8, 2016, now Pat. No. 9,803,277.

(51) Int. Cl.

| | | |
|---|---|---|
| *H01L 21/285* | (2006.01) | |
| *H01L 21/768* | (2006.01) | |
| *C23C 16/06* | (2006.01) | |
| *C23C 16/34* | (2006.01) | |
| *C23C 16/44* | (2006.01) | |
| *C23C 16/56* | (2006.01) | |

(52) U.S. Cl.
CPC ...... *C23C 16/4404* (2013.01); *C23C 16/4405* (2013.01); *C23C 16/45525* (2013.01); *C23C 16/45536* (2013.01); *C23C 16/56* (2013.01); *H01L 21/28562* (2013.01); *H01L 21/7685* (2013.01); *H01L 21/76826* (2013.01); *H01L 21/76849* (2013.01); *H01L 21/76883* (2013.01)

(56) References Cited

U.S. PATENT DOCUMENTS

| | | |
|---|---|---|
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,955,979 B2 | 6/2011 | Kostamo et al. |
| 7,964,505 B2 | 6/2011 | Khandelwal et al. |
| 8,293,597 B2 | 10/2012 | Raaijmakers |
| 8,293,658 B2 | 10/2012 | Shero et al. |
| 8,425,739 B1 | 4/2013 | Wieting |
| 8,536,058 B2 | 9/2013 | Kostamo et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Kobrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,349,687 B1 | 5/2016 | Gates et al. |
| 9,490,145 B2 | 11/2016 | Niskanen et al. |
| 9,502,289 B2 | 11/2016 | Haukka et al. |
| 9,803,277 B1 * | 10/2017 | Longrie ............... C23C 16/02 |
| 9,895,715 B2 | 2/2018 | Haukka et al. |
| 9,911,595 B1 | 3/2018 | Smith et al. |
| 10,041,166 B2 * | 8/2018 | Longrie ............... C23C 16/02 |
| 2001/0019803 A1 | 9/2001 | Mirkanimi |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0181035 A1 | 9/2003 | Yoon et al. |
| 2003/0192090 P1 | 10/2003 | Meilland |
| 2003/0193090 A1 | 10/2003 | Otani et al. |
| 2004/0092073 A1 | 5/2004 | Cabral |
| 2004/0219746 A1 | 7/2004 | Vaartstra et al. |
| 2005/0012975 A1 | 1/2005 | George et al. |
| 2005/0136604 A1 * | 6/2005 | Al-Bayati ............. H01J 37/321 |
| | | 438/301 |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0141155 A1 | 6/2006 | Gordon et al. |
| 2006/0176559 A1 | 8/2006 | Takatoshi et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0063317 A1 | 3/2007 | Kim et al. |
| 2007/0099422 A1 | 5/2007 | Wijekoon et al. |
| 2007/0241390 A1 | 10/2007 | Tanaka et al. |
| 2008/0066680 A1 | 3/2008 | Sherman |
| 2008/0072819 A1 | 3/2008 | Rahtu |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0311879 A1 | 12/2009 | Blasco et al. |
| 2010/0015756 A1 | 1/2010 | Weidman et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2011/0053800 A1 | 3/2011 | Jung et al. |
| 2011/0124192 A1 | 5/2011 | Ganguli et al. |
| 2011/0146568 A1 | 6/2011 | Haukka et al. |
| 2011/0221061 A1 | 9/2011 | Prakash |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0089983 A1 | 4/2013 | Sugita et al. |
| 2013/0095664 A1 | 4/2013 | Matero et al. |

(56) References Cited

U.S. PATENT DOCUMENTS

| | | |
|---|---|---|
| 2013/0115768 A1 | 5/2013 | Pore et al. |
| 2013/0146881 A1 | 6/2013 | Yamazaki et al. |
| 2013/0189837 A1 | 7/2013 | Haukka et al. |
| 2013/0196502 A1* | 8/2013 | Haukka ............ H01L 21/02068 438/653 |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0273290 A1 | 9/2014 | Somervell |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0011093 A1* | 1/2015 | Singh ................ H01J 37/32422 438/712 |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0299848 A1 | 10/2015 | Haukka et al. |
| 2015/0371866 A1 | 12/2015 | Chen et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0293398 A1 | 10/2016 | Danek et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0352533 A1 | 12/2017 | Tois et al. |
| 2017/0352550 A1 | 12/2017 | Tois et al. |
| 2018/0080121 A1 | 3/2018 | Longrie et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |

FOREIGN PATENT DOCUMENTS

| | | |
|---|---|---|
| EP | 1340269 | 2/2009 |
| JP | 4333900 | 9/2009 |
| JP | 2011-187583 | 9/2011 |
| JP | 2014-93331 | 5/2014 |
| KR | 102001001072 | 2/2001 |
| KR | 20030027392 | 4/2003 |
| KR | 1020040056026 | 6/2004 |
| KR | 10-0869326 | 11/2008 |
| KR | 10-2012-0120902 | 11/2012 |
| TW | 175767 | 8/2003 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2017/184357 | 10/2017 |
| WO | WO 2017/184358 | 10/2017 |

OTHER PUBLICATIONS

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly( methyl methacrylate) Films as Mask Layers, J. Phys. Chem. C, 2008, 112, pp. 15791-15795. (Year: 2008).

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.

File History of U.S. Appl. No. 15/177,195, filed Jun. 8, 2016.
File History of U.S. Appl. No. 13/702,992, filed Mar. 26, 2013.
File History of U.S. Appl. No. 13/708,863, filed Dec. 7, 2012.
George, Steven M.; Atomic Layer Deposition: An Overview; Chem. Rev. 2010, 110, pp. 111-131; Steven M.; Atomic Layer Deposition: An Overview; Chem. Rev. 2010, 110, pp. 111-131; Feb. 12, 2009.

(56) References Cited

OTHER PUBLICATIONS

Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hymes et al., "Surface cleaning of copper by thermal and plasma treatment in reducing and inert ambients", J. Vac. Sci. Technol. B, vol. 16, No. 3, May-Jun. 1998, pp. 1107-1109.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.
Lee et al., Area-Selective Atomic Layer Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar-Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films, 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Maluf et al., "Selective tungsten filling of sub-0.25 μm trenches for the fabrication of scaled contacts and x-ray masks", J. Vac. Sci. Technol. B, vol. 8, No. 3, May-Jun. 1990, pp. 568-569.
Norrman, et al.; 6 Studies of Spin-Coated Polymer Films; Annu. Rep. Prag. Chem.; Sect. C; 2005; 101; pp. 174-201.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Sundberg, et al.; Organic and Inorganic-Organic Thin Film Structures by Molecular Layer Deposition: A Review; Beilstein J. Nanotechnol; 2014, 5, pp. 1104-1136.
Toirov, et al.; Thermal Cyclodehydration of Polyamic Acid Initiated by UV-Irradiation; Iranian Polymer Journal; vol. 5, No. 1; pp. 16-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Yu et al., "Gas/surface reactions in the chemical vapor deposition of tungsten using WF6/SiH4 mixtures", J. Vac. Sci. Technol. A, vol. 7, No. 3, May-Jun. 1989, pp. 625-629.
Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.
International Search Report and Written Opinion dated Feb. 17, 2012 in Application No. PCT/US2011/039970, filed Jun. 10, 2011.
Notice of Allowance dated Apr. 5, 2017 in U.S. Appl. No. 15/177,195.
Office Action dated Aug. 29, 2014 in U.S. Appl. No. 13/702,992.
Office Action dated Nov. 7, 2014 in U.S. Appl. No. 13/708,863.
Office Action dated Jun. 8, 2017 in Korean Application No. 2013-7000596.
Office Action dated Jan. 26, 2018 in U.S. Appl. No. 15/795,768.
File History of U.S. Appl. No. 15/795,768, filed Oct. 27, 2017.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
Aaltonen et al., "Atomic Layer Deposition of Iridium Thin Films", Journal of the Electrochemical Society, 151 (8) G489-G492 (2004).
Benzotriazole, Wikipedia via https://en.wikipedia.org/wiki/Benzotriazole; pp. 1-5, no date available.
Farm et al., "Self-Assembled Octadecyltrimethoxysilane Monolayers Enabling Selective-Area Atomic Layer Deposition of Iridium", Chem. Vap. Deposition, 2006, 12, pp. 415-417.

(56) References Cited

OTHER PUBLICATIONS

File History of U.S. Appl. No. 14/612,784, filed Feb. 3, 2015.
File History of U.S. Appl. No. 15/877,632, filed Jan. 23, 2018.
File History of U.S. Appl. No. 14/687,833, filed Apr. 15, 2015.
File History of U.S. Appl. No. 16/100,855 filed Aug. 10, 2018.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 15/432,263, filed Feb. 14, 2017.
File History of U.S. Appl. No. 16/158,780, filed Oct. 12, 2018.
File History of U.S. Appl. No. 15/221,453, filed Jul. 27, 2016.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
Formic Acid, Wikipedia via https://en.wikipedia.org/wiki/Formic_acid; pp. 1-5, no date available.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Mackus et al., "The use of atomic layer deposition in advanced nanopatterning", Nanoscale, 2014, 6, pp. 10941-10960.
Schuiskly et al., "Atomic Layer Deposition of Thin Films Using O2 as Oxygen Source", Langmuir, vol. 17, No. 18, 2001, pp. 5508-5512.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.

\* cited by examiner

REACTION CHAMBER PASSIVATION AND SELECTIVE DEPOSITION OF METALLIC FILMS

CROSS-REFERENCE TO RELATED APPLICATIONS

This application is a continuation of U.S. application Ser. No. 15/795,768, filed Oct. 27, 2017, which is a continuation of Ser. No. 15/177,195, filed Jun. 8, 2016, and is related to U.S. application Ser. No. 15/177,198 filed Jun. 8, 2016, and U.S. application Ser. No. 13/708,863, filed Dec. 7, 2012, which claims priority to U.S. Provisional Application No. 61/569,142, filed Dec. 9, 2011, the disclosures of which are all hereby incorporated by reference in their entireties.

BACKGROUND

Field

The present application relates generally to the field of semiconductor fabrication.

Description of the Related Art

Integrated circuits are currently manufactured by an elaborate process in which various layers of materials are sequentially constructed in a predetermined arrangement on a semiconductor substrate.

Meeting the ever increasing electromigration (EM) requirement in copper interconnects is becoming more difficult as Moore's law progresses, resulting in smaller devices. As line dimensions shrink, critical void size for EM failure is also reduced, causing a sharp decrease in mean time to failure. A significant improvement in EM resistance is required to enable continued scaling.

The interface between the dielectric diffusion barrier and metallic material has been shown to be the main path for metallic material diffusion and the weakest link in resisting EM failure. The implementation of a selective metal cap has been challenging because of the difficulty in achieving good selectivity on metallic surfaces versus the dielectric surface. Methods are disclosed herein for selective deposition of metallic films that can be used in this context to decrease electromigration.

Selective deposition of tungsten advantageously reduces the need for complicated patterning steps during semiconductor device fabrication. However, gentle surface treatments, such as thermal or radical treatments are typically preferred to provide desired surface terminations for selective deposition. Such surface treatments may not adequately prepare the desired surface for selective deposition, leading to a loss of selectivity.

SUMMARY

In some aspects processes are presented for passivating a reaction chamber prior to conducting a selective deposition process therein. In some embodiments the processes may comprise providing a reaction chamber that does not comprise a wafer depositing a passivation layer on an interior surface of the reaction chamber, wherein the interior surface may be exposed to a precursor during a subsequent selective deposition process providing at least one wafer comprising a first metallic surface and a second surface comprising silicon into the reaction chamber performing a selective deposition process on the at least one wafer within the reaction chamber, wherein the selective deposition process comprises at least one selective deposition cycle.

In some embodiments the process further comprises repeating the depositing a passivation layer step after a number of selective deposition cycles have been performed. In some embodiments the process further comprises subjecting an interior surface of the reaction chamber to an etch process prior to depositing a passivation layer on an interior surface of the reaction chamber. In some embodiments no substrate or wafer is present in the reaction chamber during the deposition of the passivation layer on the interior surface of the reaction chamber. In some embodiments the passivation layer is deposited by a vapor deposition process. In some embodiments the passivation layer is deposited by an atomic layer deposition (ALD) process. In some embodiments the passivation layer is deposited by a plasma enhanced atomic layer deposition (PEALD) process. In some embodiments the passivation layer is deposited by a chemical vapor deposition (CVD) process. In some embodiments the passivation layer is deposited by a plasma enhanced CVD (PECVD) process. In some embodiments the passivation layer is formed by alternately and sequentially exposing the reaction chamber to a first precursor comprising disilane and a second precursor comprising atomic nitrogen, nitrogen radicals, or nitrogen plasma and atomic hydrogen, hydrogen radicals or hydrogen plasma. In some embodiments the passivation layer comprises SiN. In some embodiments the passivation layer does not comprise pure metal or pure silicon. In some embodiments the passivation layer is formed by oxidizing a metal deposited on an interior surface of the reaction chamber. In some embodiments the metal is deposited on the interior surface of the reaction chamber by selective deposition process. In some embodiments the metal comprises tungsten. In some embodiments the passivation layer has a thickness of from about 5 nm to about 500 nm. In some embodiments the selective deposition process has a selectivity of greater than about 50%. In some embodiments the selective deposition process has a selectivity of greater than about 90%.

In some aspects processes are provided for passivating a reaction chamber prior to conducting a selective deposition process therein. In some embodiments the processes may comprise providing a reaction chamber that does not comprise a wafer, depositing a passivation layer on an interior surface of the reaction chamber, wherein the interior surface may be exposed to a precursor during a subsequent selective deposition process, providing at least one wafer comprising a first metallic surface and a second surface comprising silicon into the reaction chamber, performing a selective deposition process on the at least one wafer within the reaction chamber, wherein the selective deposition process comprises at least one selective deposition cycle, and intermittently repeating the depositing a passivation layer step during the selective deposition process.

In some aspects processes are provided for selectively depositing a film on a substrate comprising a first metallic surface and a second surface comprising silicon. In some embodiments the processes may comprise passivating a reaction chamber in which a selective deposition process is to be performed, subjecting the substrate to a first surface treatment process comprising exposing the substrate to a treatment reactant, subsequent to the first surface treatment process, performing one or more selective deposition cycles in the reaction chamber, each cycle comprising, contacting the substrate with a first precursor comprising silicon or boron to selectively form a layer of first material comprising Si or B on the first metallic surface relative to the second surface comprising silicon, and converting the first material on the first metallic surface to a second metallic material by exposing the first material to a second precursor comprising metal. In some embodiments the second metallic material is deposited on the first metallic surface of the substrate relative to the second surface comprising silicon with a selectivity of greater than about 50%.

In some embodiments the first metallic surface comprises copper. In some embodiments the first metallic surface comprises cobalt. In some embodiments the first metallic surface comprises tungsten, a native oxide of tungsten, or tungsten oxide. In some embodiments the second surface comprising silicon comprises $SiO_2$. In some embodiments the second metallic material comprises tungsten. In some embodiments passivating the reaction chamber comprises depositing a passivation layer on surfaces in the reaction chamber which may be exposed to the first or second precursor during one or more of the selective deposition cycles. In some embodiments the passivation layer is formed by a vapor deposition process. In some embodiments the passivation layer is formed by a chemical vapor deposition (CVD) process. In some embodiments the passivation layer is formed by an atomic layer deposition (ALD) process. In some embodiments the passivation layer is formed by conducting a first vapor phase silicon precursor and a second vapor phase nitrogen precursor into the reaction chamber. In some embodiments the passivation layer is formed by alternately and sequentially exposing the reaction chamber to a first passivation layer precursor comprising disilane and a second passivation layer precursor comprising nitrogen. In some embodiments the passivation layer is formed by alternately and sequentially exposing the reaction chamber to a first passivation layer precursor comprising disilane, a second passivation layer precursor comprising a metal halide, and a third passivation layer precursor comprising an aminosilane. In some embodiments the passivation layer comprises SiN. In some embodiments the treatment reactant comprises formic acid. In some embodiments the treatment reactant comprises $NH_3$. In some embodiments the first surface treatment process is carried out at a temperature of from about 30° C. to about 110° C. In some embodiments the first precursor comprises a silane. In some embodiments the first precursor comprises disilane. In some embodiments the second precursor comprises a metal halide. In some embodiments the second precursor comprises $WF_6$. In some embodiments the process further comprises subjecting the substrate to a second surface treatment process prior to subjecting the substrate to a first surface treatment process. In some embodiments the second surface treatment process comprises exposing the substrate to a second surface treatment reactant, wherein the second surface treatment reactant passivates the second surface. In some embodiments the second metallic material is deposited on the first metallic surface of the substrate relative to the second surface comprising silicon with a selectivity of greater than about 90%.

DETAILED DESCRIPTION

In some embodiments, methods are disclosed for selective deposition of metallic films on metal or metallic materials while avoiding deposition on silicon containing materials, such as silicon dioxide. For example, a metallic film may be deposited on copper for end of the line substrate processing. In some embodiments, metallic films are deposited on an integrated circuit workpiece comprising copper lines in silicon containing material.

In some such applications, the selective deposition methods disclosed herein can be used to deposit material onto copper thereby decreasing electromigration of the copper. In some embodiments, the selective deposition is on the copper metal layers and not on silicon containing materials on the substrate. Deposition on the silicon containing materials in these applications is undesirable because it can decrease the effective dielectric value.

In some embodiments, the process flows described herein are used to selectively deposit metal on micrometer-scale (or smaller) features during integrated circuit fabrication. In some embodiments feature size may be less than 100 micrometers, less than 1 micrometer or less than 200 nm. In the case of selective deposition of W on Cu for interconnect applications, in some embodiments the feature size/line widths may be less than 1 micrometer, less than 200 nm, less than 100 nm, or even less than 50 nm. Of course the skilled artisan will recognize that selective deposition on larger features and in other contexts is possible using the disclosed methods.

In some embodiments, the selective deposition can avoid additional processing steps, thereby saving time and decreasing the costs associated with processing the substrates. For example, lithography will be very expensive in the future for small dimensions. With 8 or more layers of Cu metallization in the chips, the time and cost savings achievable using selective deposition are magnified because time is saved for each area of copper metallization during substrate processing. Also, the methods disclosed herein can obviate the need for diffusion barriers and other processing steps.

Figure 1:
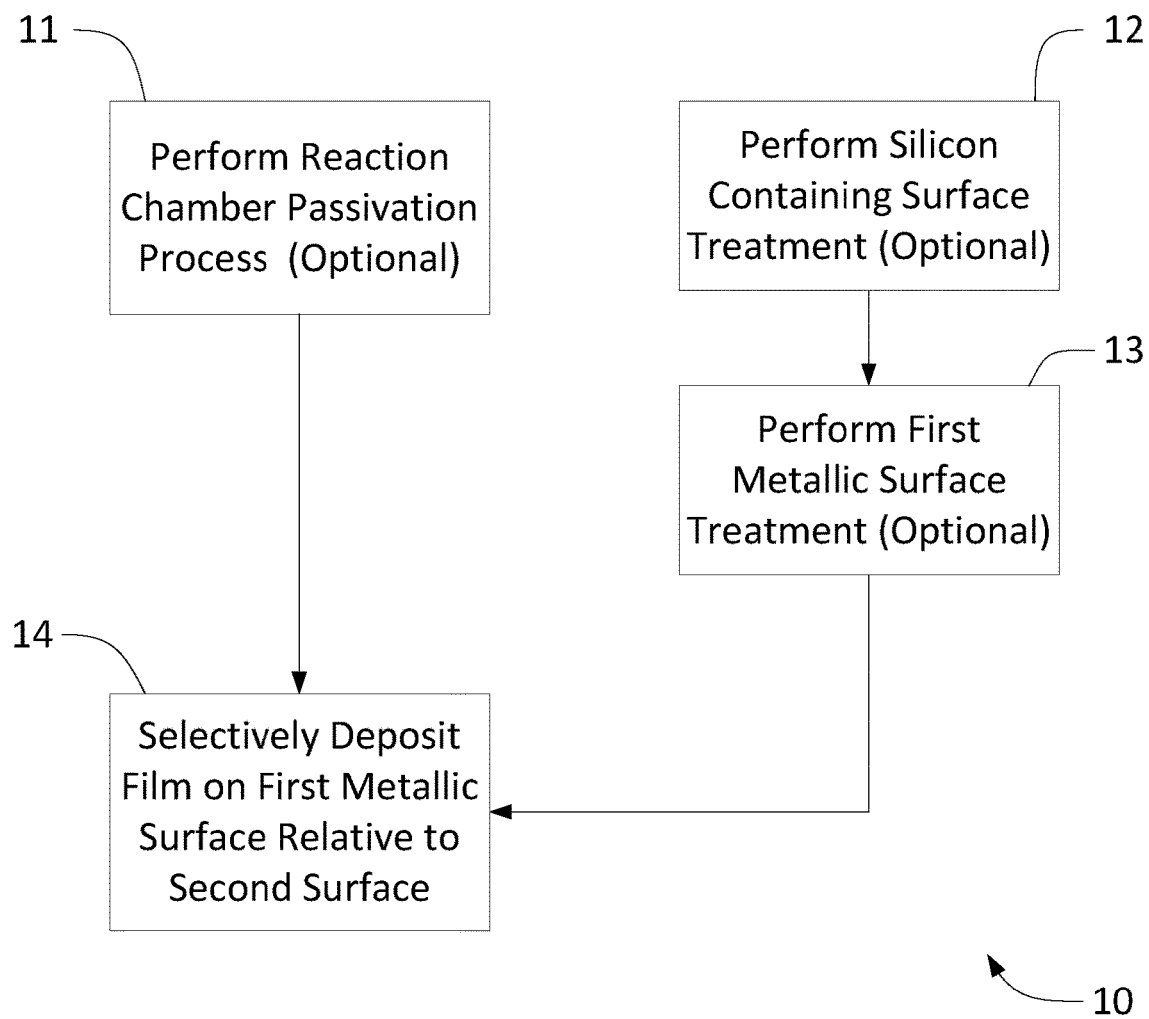
FIG. 1 is a flow chart generally illustrating a process for selectively depositing a metal film on a first metallic surface of a substrate relative to a second silicon containing surface.

FIG. 1 is a flow chart generally illustrating a process 10 for selectively depositing a metal film on a first metallic surface of a substrate relative to a second silicon containing surface. In some embodiments the process may comprise an optional reaction chamber passivation step 11 prior to a selective deposition step 14 in order to enable selective deposition, improve selectivity, and/or increase the number of consecutive cycles before selectivity is lost during a selective deposition process. In some embodiments the reaction chamber passivation step 11 may increase the number of consecutive cycles in which a desired level of selectivity is achieved. The optional reaction chamber passivation step 11 may include providing a passivation material or passivation layer on chamber surfaces and other locations which may be exposed to a precursor or reactant during the selective deposition step 14. The reaction chamber passivation step 11 may limit or prevent deposition of metallic material on chamber surfaces during a subsequent selective deposition step 14, thereby reducing or eliminating the amount of reactive byproducts generated by the selective deposition step 14. In some embodiments the reaction chamber passivation step 11 may reduce contamination of the substrate during the selective deposition step 14 which in turn may enable selective deposition or increase selectivity.

In some embodiments the passivation layer may comprise, for example, SiN. In some embodiments the passivation layer may comprise a metal oxide and may be formed by, for example, oxidizing a metallic material that is present on chamber surfaces. In some embodiments the passivation layer may not be pure metal or pure silicon.

Selective deposition using the methods described herein does not require treatment of the silicon containing layer to block deposition thereon. As a result, in some embodiments the second surface comprising silicon does not comprise a passivation or blocking layer, such as a self-assembled monolayer (SAM), which would prevent the actual top surface of the second dielectric surface from being exposed to the chemicals of the deposition processes described herein. Thus, in some embodiments the film is deposited selectively on the first metal surface on a substrate which has not received treatment designed to prevent deposition of the film on the second silicon containing surface, such as a blocking or passivation treatment. That is, in some embodiments selective deposition can be obtained even though deposition is not blocked on the second surface comprising silicon by a blocking or passivation layer. Instead, the deposition conditions are selected such that the selective deposition process will occur without the need for pretreatment of the second surface comprising silicon prior to deposition.

In some embodiments the second silicon containing layer may be exposed to a treatment designed to treat the first surface. For example, in some embodiments it is desirable to passivate the first metal surface and the second surface comprising silicon may be exposed to the same passivation treatment as the first metal surface. For example, in the case of Cu both the first Cu surface and the second surface comprising silicon may be exposed to BTA or another passivating chemical. However, no specific further treatments or exposures (besides what it may receive during transportation of the sample) are done for the second surface comprising silicon before a first surface treatment step to remove the passivation layer from the metal surface. In particular no treatment designed to block deposition of the film on the second surface comprising silicon need be carried out.

In some embodiments at the time of selective deposition of the film, the second dielectric surface comprises only surface groups that are naturally occurring in the low-k material, and does not comprise a significant amount of functional groups or ligands that would not naturally be present in the low-k material itself. In some embodiments no active treatment of the second dielectric surface is carried out after first surface treatment that would add surface groups to the second dielectric surface. In some embodiments the second dielectric surface comprises only surface groups that are naturally occurring in low-k materials, including those that could be formed during for transportation of the substrate in air, for example.

However, in some embodiments the second silicon containing surface may optionally be treated at step 12. In some embodiments, a silicon containing surface can be treated at step 12 to enhance the selectivity of the deposition process by decreasing the amount of material deposited on the silicon containing surface, for example by passivating the silicon containing surface. In some embodiments the treatment step 12 is intended to restore the silicon containing layer and not to block deposition on the silicon containing layer. In some embodiments the second silicon containing surface treatment at step 12 may comprise contacting the second surface with treatment chemical, for example the second surface comprising silicon may be contacted with a treatment chemical comprising trimethyl(dimethylamino) silane. In some embodiments the substrate may be outgassed at the beginning of or prior to step 12 in order to remove, for example, any moisture from the substrate surface or inside the silicon containing material.

In some embodiments the substrate surface is cleaned at step 13 prior to beginning the selective deposition step 14. In some embodiments the first surface treatment step 13 may comprise exposing the substrate to a plasma, for example a plasma generated from $NH_3$. In some embodiments the first surface treatment step 13 may comprise exposing the substrate to a vapor phase treatment chemical, for example formic acid. In some embodiments the first surface treatment step 13 may reduce the first metallic surface. In some embodiments the first surface treatment step 13 may remove any native oxide that may be present on the first metallic surface. Although in some embodiments a native oxide may still be present on the first surface after the first surface treatment step 13. In some embodiments the first surface treatment step 13 may remove any hydrocarbon layer that may be present on the first metallic surface. In some embodiments the first surface treatment step 13 may provide active sites on the first metallic surface. In some embodiments the substrate may be outgassed at the beginning of, or prior to step 13 in order to remove, for example, any moisture from the substrate surface or inside the silicon containing material.

In some embodiments step 14 of the selective deposition process comprises selectively depositing a film on a substrate comprising a first metal surface and a second surface comprising silicon using a plurality of deposition cycles. The cycle comprises: contacting the substrate with a first precursor comprising silicon or boron to selectively form a layer of first material comprising Si or B over the first metal surface relative to the second surface comprising silicon; and converting the first material to a second metallic material by exposing the substrate to a second precursor comprising metal. The selective deposition step 14 involves forming a greater amount of material on the first metal surface relative to the second surface comprising silicon. The selectivity can be expressed as the ratio of material formed on the first surface to amount of material formed on the first and second surfaces combined. For example, if a process deposits 10 nm of W on a first copper surface and 1 nm on a second silicon oxide surface, the process will be considered to have 90% selectivity. Preferably, the selectivity of the methods disclosed herein is above about 80%, more preferably above 90%, even more preferably above 95%, and most preferably about 100%. In some cases the selectivity is at least about 80%, which may be selective enough for some particular applications. In some cases the selectivity is at least about 50%, which may be selective enough for some particular applications. In some embodiments, multiple deposition cycles are used to deposit material at step 14. In some embodiments the selectively deposited film is a metallic layer. The metallic layer may be elemental metal. In some embodiments, the metallic layer can include additional elements, such as Si, B, N, and/or dopants. Thus, in some embodiments the metallic layer is a metal nitride or metal silicide. As used herein, "metallic" indicates that a film, reactant or other material comprises one or more metals.

The substrate can comprise various types of materials. When manufacturing integrated circuits, the substrate typically comprises a number of thin films with varying chemical and physical properties. For example and without limitation, the substrate may comprise a silicon containing layer and a metal layer. In some embodiments the substrate can comprise metal carbide. In some embodiments the substrate can comprise a conductive oxide.

Preferably the substrate has a first surface comprising a metal, referred to herein as the first metal surface or first metallic surface. In some embodiments the first surface is essentially an elemental metal, such as Cu or Co. In some embodiments the first surface comprises a metal nitride. In some embodiments the first surface comprises a transition metal. The transition metal can be selected from the group: Ti, V, Cr, Mn, Nb, Mo, Ru, Rh, Pd, Ag, Au, Hf, Ta, W, Re, Os, Ir and Pt. In some embodiments the first surface preferably comprises copper. In some embodiments the first surface comprises cobalt. In some embodiments the first surface comprises tungsten. In some embodiments the first surface may comprise a native oxide of a metal, for example the first surface may comprise tungsten oxide. In some embodiments the first surface may comprise a seam, gap, or space, and the selective deposition process closes or substantially fills the seam, gap, or space of the first surface. In some embodiments the first surface comprises a noble metal. The noble metal can be selected from the group: Au, Pt, Ir, Pd, Os, Ag, Re, Rh, and Ru.

The second surface is preferably a silicon containing surface, referred to herein as the second silicon containing surface or second surface comprising silicon. In some embodiments, the silicon containing surface comprises, for example, $SiO_2$. In some embodiments the second surface may comprise silicon oxide, silicon nitride, silicon carbide, silicon oxynitride, silicon dioxide, or mixtures thereof. In some embodiments the material comprising the second surface is a porous material. In some embodiments the porous material contains pores which are connected to each other, while in other embodiments the pores are not connected to each other. In some embodiments the second surface comprises a low-k material, defined as an insulator with a dielectric value below about 4.0. In some embodiments the dielectric value of the low-k material is below about 3.5, below about 3.0, below about 2.5 and below about 2.3.

The precursors employed in the processes disclosed herein may be solid, liquid or gaseous material under standard conditions (room temperature and atmospheric pressure), provided that the precursors are in vapor phase before being conducted into the reaction chamber and contacted with the substrate surface. Plasma conditions can also be used. Thus, plasma can be formed from the vapor phase reactants or precursors in some embodiments. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. In some cases to ensure full saturation of reactions, the precursor might be supplied in multiple shorter pulses rather than in one longer pulse.

The mass flow rate of the precursors can also be determined by the skilled artisan. In one embodiment, for deposition on 300 mm wafers the flow rate of precursors is preferably between about 1 and 2000 sccm without limitation. In some embodiments the flow rate may be between about 50 sccm and about 1500 sccm, between about 100 sccm and about 1000 sccm, or between about 200 sccm and about 500 sccm.

The pressure in the reaction chamber is typically from about 0.01 to about 50 mbar. In some embodiments the pressure may be between about 0.1 mbar and about 20 mbar, or between about 1 mbar and about 10 mbar. However, in some cases the pressure will be higher or lower than this range, as can be readily determined by the skilled artisan.

Chamber Passivation

Referring again to FIG. 1, in some embodiments it may be desirable for the reaction chamber or chambers in which a selective deposition process will be carried out to be passivated at step 11 prior to selectively depositing a metallic film at step 14. In some embodiments the reaction chamber passivation step 11 may enable selective deposition, improve selectivity, and/or increase the number of cycles before selectivity is lost during a selective deposition process, for example a metallic film selective deposition process as described herein.

In some embodiments a selective deposition process for selective depositing a film on the first surface of a substrate, for example a metallic surface, relative to a second surface, for example a silicon containing surface can generate reactive byproducts which can rapidly damage the second surface. The reactive byproducts may provide active sites on the second surface, resulting in a loss of selectivity. In some embodiments unwanted deposition may occur on reaction chamber surfaces, thereby leading to an increased amount of reactive byproducts in the reaction chamber over a selective deposition process wherein deposition occurs primarily on the substrate. In order to reduce the amount of unwanted deposition on chamber surfaces, for example the interior surfaces of the reaction chamber, and consequently reduce the amount of reactive byproducts generated by the selective deposition process it is desirable to passivate these chamber surfaces against deposition.

For example, in some embodiments a W selective deposition process may generate reactive byproducts having the formula $SiF_x$, where x=1-4. In some embodiments where the reaction chamber has not been passivated, unwanted W deposition may occur on chamber surfaces, thereby producing an undesirable amount of $SiF_x$ byproducts. In some embodiments where a reaction chamber has been passivated, W deposition may occur primarily on the first surface of the substrate and may not occur on unwanted chamber surfaces, thereby leading to a reduction in the amount of $SiF_x$ byproducts generated during the selective deposition process relative to a W selective deposition process wherein the reaction chamber had not been passivated.

In some embodiments the reaction chamber passivation step 11 is performed when there is no wafer or substrate in the reaction chamber. Therefore, in some embodiments a substrate, for example a substrate comprising a first metallic surface and a second silicon containing surface is not subjected to the reaction chamber passivation step 11. In some embodiments the substrate may be subjected to other processing before, during, or after the reaction chamber passivation step 11.

In some embodiments the reaction chamber passivation step 11 may be repeated after a selective deposition process has been performed at step 14. In some embodiments the reaction chamber passivation step 11 may be repeated after every one, two, three, or more selective deposition steps 14 have been carried out. For example, in some embodiments the reaction chamber passivation step 11 may be repeated after every 1, 5, 10, 20, 50, or more substrates, for example wafers, have been subjected to selective deposition step 14. In some embodiments the reaction chamber passivation step 11 may be repeated after a certain number of cycles of selective deposition step 14 have been performed. In some embodiments the reaction chamber passivation step 11 may be repeated after every 50, 100, 150, or more selective deposition cycles. In some embodiments the substrate or substrates may remain in the reaction chamber, or may not be present in the reaction chamber during the reaction chamber passivation step 11.

In some embodiments a reaction chamber passivation step 11 may include providing a passivation layer or passivation material on chamber surfaces and other surfaces in which may be exposed to a precursor or reactant during the selective deposition step 14. In some embodiments the passivation material is deposited or formed on the interior surface of the reaction chamber, the chamber showerhead, and/or any other parts of the chamber which may be exposed to a precursor or reactant during selective deposition step 14. In some embodiments the passivation material may be deposited on any surface in the reaction chamber that is not the substrate upon which selective deposition is desired to occur. In some embodiments the passivation material is a different material than the material being selectively deposited in step 14. In some embodiments a disposition process used to deposit the passivation layer may not be a selective deposition process.

In some embodiments reaction chamber passivation 11 can increase the number of consecutive cycles in which a desired level of selectivity of a selective deposition process 14 is maintained. In some embodiments a reaction chamber passivation process 11 can increase the number of consecutive cycles in which a desired level of selectivity of a selective deposition process 14 is maintained by more than about 50% as compared to a reaction chamber that has not been subjected to any reaction chamber passivation process 11. In some embodiments a reaction chamber passivation process 11 can increase the number of consecutive cycles in which a desired level of selectivity of a selective deposition process 14 is maintained by more than about 75%, more than about 100%, more than about 200%, more than about 400%, or more than about 900% as compared to a reaction chamber that has not been subjected to any reaction chamber passivation process 11. In some embodiments a reaction chamber passivation process 11 can increase the number of consecutive cycles in which a desired level of selectivity of a selective deposition process 14 is maintained by more than about 20 times as compared to a reaction chamber that has not been subjected to any reaction chamber passivation process 11.

In some embodiments a reaction chamber passivation process 11 can increase the number of consecutive cycles in which a desired level of selectively of a selective deposition process 14 is maintained, and the reaction chamber passivation process 11 can be repeated after a desired number of cycles in order to allow for additional consecutive cycles in which a desired level of selectively of a selective deposition process 14 is maintained. That is, the reaction chamber passivation process 11 can be performed after a desired number of consecutive cycles and before the selectivity of the selective deposition process has decreased to below a desired level in order to allow for additional consecutive cycles in which a desired level of selectivity of the selective deposition process is maintained. In some embodiments the reaction chamber passivation 11 may be repeated any number of times after a desired number of consecutive cycles of a selective deposition process in order to maintain the desired level of selectivity of the selective deposition process 14.

In some embodiments a previously deposited passivation layer or layers may be etched, or at least partially removed from the interior surfaces of the reaction chamber prior to the deposition of a subsequent passivation layer via a reaction chamber passivation process 11. In some embodiments a previously deposited passivation layer or layers may be etched or at least partially removed from the interior surfaces of the reaction chamber after the reaction chamber has been subjected to two or more, five or more, or ten or more reaction chamber passivation processes 11. In some embodiments no etching or layer removal is performed between the two or more, five or more, or ten or more reaction chamber passivation processes. In some embodiments the reaction chamber may then be subjected to a reaction chamber passivation process 11 after the previously deposited passivation layer or layers have been etched or at least partially removed from the interior surfaces of the reaction chamber.

In some embodiments reaction chamber passivation 11 can increase the duration for which a desired level of selectivity of a selective deposition process 14 is maintained. In some embodiments a reaction chamber passivation process 11 can increase the duration for which a desired level of selectivity of a selective deposition process 14 is maintained by more than about 50%, more than about 75%, more than about 100%, more than about 200%, more than about 400%, or more than about 900% as compared to a reaction chamber that has not been subjected to any reaction chamber passivation process 11. In some embodiments a reaction chamber passivation process 11 can increase the duration for which a desired level of selectivity of a selective deposition process 14 is maintained by more than about 20 times as compared to a reaction chamber that has not been subjected to any reaction chamber passivation process 11.

In some embodiments reaction chamber passivation 11 can increase the number of substrates, for example, wafers, for which a desired level of selectivity of a selective deposition process 14 is maintained. That is, reaction chamber passivation 11 can increase the number of wafers on which selective deposition can be carried out simultaneously while maintaining a desired level of selectivity. In some embodiments a reaction chamber passivation process 11 can increase the number of substrates for which a desired level of selectivity of a selective deposition process 14 is maintained by more than about 2 times, more than about 5 times, more than about 10 times, more than about 20 times, or more than about 50 times as compared to a reaction chamber that has not been subjected to any reaction chamber passivation process 11.

In some embodiments a reaction chamber passivation process 11 can extend the number of deposition cycles which can be performed in the reaction chamber before maintenance, for example cleaning of the reaction chamber and/or reaction chamber components is required. In some embodiments a reaction chamber passivation process 11 can extend the number of deposition cycles which can be performed in the reaction chamber before maintenance is required by more than about 50%, more than about 75%, more than about 100%, more than about 200%, more than about 400%, more than about 900%, or more than about 20 times as compared to a reaction chamber that has not been subjected to any reaction chamber passivation process 11

In some embodiments during a selective deposition process, material may be deposited on interior surfaces of the reaction chamber. This deposited material may flake off and interfere with selective deposition, or may provide for reactive sites such that an undesirably high amount of undesirable reaction byproducts may be generated during a selective deposition process. Thus, it may be necessary to remove deposited material from the interior surfaces of the reaction chamber periodically. In some embodiments a reaction chamber passivation process 11 can extend the number of deposition cycles which can be performed in the reaction chamber before etching or removing undesired material deposited on the interior surfaces of the reaction chamber, for example via in-situ etching, must be performed to obtain or maintain a desired level of selectivity. In some embodiments a reaction chamber passivation process 11 can extend the number of deposition cycles which can be performed in the reaction chamber before etching, for example in-situ etching, must be performed to obtain or maintain a desired level of selectivity by more than about 50%, more than about 75%, more than about 100%, more than about 200%, more than about 400%, more than about 900%, or more than about 20 times as compared to a reaction chamber that has not been subjected to any reaction chamber passivation process 11.

In some embodiments the passivation layer deposited or formed during the reaction chamber passivation step 11 may comprise SiN. In some embodiments the passivation layer may comprise silicon oxide, silicon nitride, silicon carbide, silicon oxynitride, or mixtures thereof. In some embodiments the passivation layer may comprise a metal oxide. In some embodiments the passivation layer may comprise any material other than pure metal or pure silicon. In some embodiments the passivation layer is not a self-assembled monolayer (SAM) or a similar layer utilizing molecules similar to those used to form a SAM.

In some embodiments the passivation layer may be deposited or formed at step 11 by a vapor deposition process. In some embodiments the deposition process for forming the passivation layer may comprise a vapor deposition process that is chemically driven. That is, the deposition process for forming the passivation layer is a vapor deposition process that depends on one or more chemical reactions of precursors, and is not a physical vapor deposition process. For example the deposition process for forming or depositing the passivation layer may be a chemical vapor deposition (CVD) process, or atomic layer deposition (ALD) process. In some embodiments the passivation layer may be formed by a plasma enhanced ALD (PEALD) process or a plasma enhanced CVD (PECVD) process.

In some embodiments a deposition process for forming the passivation layer may comprise between 1 and 10,000 deposition cycles, between 5 and 5,000 deposition cycles, between 10 and 2,500 deposition cycles, or between 10 and 50 deposition cycles. In some embodiments the passivation layer may have a thickness of from about 1 nm to about 1000 nm, from about 5 nm to about 500 nm, from about 10 nm to about 250 nm, or from about 40 nm to about 150 nm. In some embodiments, however, it may be useful for the passivation layer to have a thickness of less than 1 nm. In some embodiments the passivation layer may have a thickness of less than about 200 nm, less than about 100 nm, less than about 50 nm and less than about 25 nm.

In some embodiments the deposition process for forming the passivation layer may comprise an ALD type process comprising one or more deposition cycles, a deposition cycle comprising alternately and sequentially exposing or contacting the reaction chamber surfaces to a first vapor phase precursor and a second vapor phase precursor. In some embodiments the first vapor phase precursor and reaction byproducts, if any, may be removed from the reaction chamber before exposing or contacting the reaction chamber surfaces to a second vapor phase precursor. In some embodiments the second vapor phase precursor and any reaction byproducts may similarly be removed from the reaction chamber before subsequently exposing or contacting the reaction chamber surfaces to the first vapor phase precursor.

In some embodiments the deposition process for forming the passivation layer may comprise a CVD type process wherein a first vapor phase precursor and a second vapor phase precursor are conducted into a reaction chamber in simultaneous or overlapping pulses, wherein the precursors react and/or decomposed on the chamber surfaces to form the passivation layer.

In some embodiments the deposition process for forming the passivation layer may comprise a PECVD type process wherein a first vapor phase precursor and a second vapor phase precursor are conducted into a reaction chamber in simultaneous or overlapping pulses, and wherein a plasma is generated in the reaction chamber. The precursors react and/or decompose in the plasma and/or on the chamber surfaces to form the passivation layer. In some embodiments a plasma may be generated remotely and introduced into the reaction chamber.

In some embodiments a deposition process for forming a passivation layer comprising SiN may be a PECVD process. In some embodiments a PECVD deposition process may utilize a vapor phase silicon precursor and a vapor phase nitrogen precursor. In some embodiments the silicon precursor and the nitrogen precursor may be provided into the reaction chamber together or in overlapping pulses. In some embodiments a plasma is generated in the reaction chamber and the silicon and nitrogen precursors react and/or decompose to form a SiN passivation layer on the chamber surfaces. In some embodiments a plasma may be generated remotely and introduced into the reaction chamber.

In some embodiments a deposition process for forming a passivation layer comprising silicon, such as SiN, may utilize a silicon precursor and one or more additional precursors, such as a nitrogen precursor. In some embodiments a deposition process for forming a passivation layer may utilize nitrogen precursor. In some embodiments the silicon precursor used in the passivation layer deposition process may comprise a silane, for example silane, disilane, or trisilane. In some embodiments the nitrogen precursor may atomic nitrogen, nitrogen radicals, nitrogen plasma, or combinations thereof. In some embodiments the nitrogen precursor may further comprise atomic hydrogen, hydrogen radicals, hydrogen plasma, or combinations thereof. In some embodiments the nitrogen precursor may comprise plasma generated from $N_2$. In some embodiments the nitrogen precursor may comprise a plasma generated from $N_2$ and $H_2$. In some embodiments the nitrogen precursor may comprise plasma generated from $N_2$ and a noble gas, for example argon. In some embodiments the nitrogen precursor may comprise plasma generated from $N_2$, $H_2$, and a noble gas, for example argon. In some embodiments the silicon precursor and the nitrogen precursor may be provided into the reaction chamber separately in an ALD type reaction or may be provided into the reaction chamber together or in overlapping pulses in a CVD reaction.

In some embodiments a deposition process for forming a passivation layer, for example a passivation layer comprising silicon an nitrogen such as SiN, may comprise one or more deposition cycles, a deposition cycle comprising alternately and sequentially exposing or contacting the reaction chamber surfaces to a first vapor phase precursor, a second vapor phase precursor, and a third vapor phase precursor. In some embodiments the first vapor phase precursor may comprise a silane; the second vapor phase precursor may comprise a metal halide; and the third vapor phase precursor may comprise an aminosilane. In some embodiments the first vapor phase precursor may comprise disilane; the second vapor phase precursor may comprise $WF_6$; and the third vapor phase precursor may comprise trimethyl(dimethylamino)silane.

The terms first, second, and third precursor are used herein for reference only and the skilled artisan will understand that a deposition cycle may begin with exposure of the reaction chamber surfaces to any of the first, second, or third vapor phase precursor. In some embodiments the first vapor phase precursor may contact the substrate prior to the second or third vapor phase precursors. In some embodiments the second vapor phase precursor may contact the substrate after the first vapor phase precursor and before the third vapor phase precursor. In some embodiments the third vapor phase precursor may contact the substrate after both the first and second vapor phase precursors. In some embodiments the order in which the first, second, and third vapor phase precursors may be different. In some embodiments two, three, or more precursors may be provided together or at least in partially overlapping pulses without regard for being referred to as the first, second, third, etc. precursor. Further, the reaction chamber surfaces may be alternately and sequentially contacted with the vapor phase precursors in any ordered as determined by the skilled artisan. For example, the chamber surfaces may be contacted with the third vapor phase precursor prior to contacting the surfaces with the second vapor phase precursor in a given deposition cycle.

In some embodiments a passivation layer deposition process utilizing a first, second, and third vapor phase precursors may comprise one or more deposition cycles, three or more deposition cycles, five or more deposition cycles or ten or more deposition cycles, 25 or more deposition cycles and in some instances less than or equal to 50 deposition cycles.

In some embodiments the passivation layer deposited by a passivation layer deposition process utilizing a first, second, and third vapor phase precursor is deposited after every selective deposition process 14, or after every substrate, for example a wafer, which has been subjected to a selective deposition process 14. That is, after a selective deposition process the substrate may be removed from the reaction chamber and an additional passivation layer may be deposited by a passivation layer deposition process. In some embodiments an additional passivation layer is deposited by a passivation layer deposition process after every substrate that has been subjected to a selective deposition process.

In some embodiments the passivation layer deposited by a passivation layer deposition process utilizing a first, second, and third vapor phase precursor is deposited after more than every two substrates, more than every four substrates, more than every nine substrates, or more than every 19 substrates which have been subjected to a selective deposition process 14.

In some embodiments a deposition process for forming the passivation layer may be carried out at a similar or the same reaction chamber pressure and temperature as a selective deposition process as described herein. In some embodiments the flow rates of the vapor phase precursors used in the passivation layer deposition process may be similar or the same as the precursor flow rates used in a selective deposition process as described herein.

In some embodiments a passivation layer may be deposited at a temperature of less than about 400° C. In some embodiments a passivation layer may be deposited at a temperature of less than about 250° C. In some embodiments a passivation layer may be deposited at a temperature of less than about 150° C. In some embodiments the passivation layer may be deposited at a temperature of less than about 100° C.

In some embodiments the passivation layer may be deposited at, for example, from about 20° C. to about 250° C., from about 30° C. to about 200° C., or from about 40° C. to 150° C. In some embodiments the passivation layer may be deposited at about the same temperature at which a subsequent selective deposition process may be performed.

In some embodiments the chamber surfaces onto which the passivation layer is deposited may optionally be cleaned prior to depositing the passivation layer. In some embodiments the chamber surfaces may be cleaned by exposing the chamber surfaces to a plasma. For example, in some embodiments the reaction chamber may be cleaned by a process comprising exposing the reaction chamber to radicals comprising fluorine, such as $NF_3$-based radicals.

In some embodiments a metal oxide passivation layer may be formed by a vapor deposition process, for example an ALD, CVD, PEALD, or PECVD process. In some embodiments a deposition process for forming the passivation layer may comprise between 1 and 10,000 deposition cycles, between 5 and 5,000 deposition cycles, between 10 and 2,500 deposition cycles, or between 10 and 50 deposition cycles.

In some embodiments the passivation layer may comprise a metal oxide. In some embodiments the passivation layer may comprise a transition metal oxide. In some embodiments the passivation layer may comprise, for example, tantalum oxide ($Ta_2O_5$), titanium oxide ($TiO_2$), niobium oxide ($Nb_2O_5$), zirconium oxide ($ZrO_2$), hafnium oxide ($HfO_2$), tungsten oxide ($WO_x$), molybdenum oxide ($MoO_x$), or vanadium oxide ($VO_x$). In some embodiments a passivation layer comprising a transition metal oxide may be formed by a deposition process comprising one or more deposition cycles comprising alternately and sequentially exposing or contacting the reaction chamber surfaces to a first vapor phase precursor and a second vapor phase precursor. In some embodiments the deposition process may be an ALD, CVD, PEALD, or PECVD process. In some embodiments the first vapor phase precursor may comprise a transition metal. In some embodiments the first vapor phase precursor may comprise a metal halide or an organometallic compound. In some embodiments the second vapor phase precursor may comprise oxygen. In some embodiments the second vapor phase precursor may be an oxygen reactant or oxygen source. In some embodiments the second vapor phase precursor may comprise $O_3$, $H_2O$, $H_2O_2$, oxygen atoms, oxygen plasma, oxygen radicals, or combinations thereof.

In some embodiments a passivation layer comprising $Al_2O_3$ may be formed by a deposition process comprising one or more deposition cycles comprising alternately and sequentially exposing or contacting the reaction chamber surfaces to a first vapor phase precursor comprising aluminum and a second vapor phase precursor comprising oxygen. In some embodiments the first vapor phase precursor comprising aluminum may comprise an organometallic compound comprising aluminum, for example trimethylaluminum (TMA). In some embodiments the second vapor phase precursor comprising oxygen may comprise $O_3$, $H_2O$, $H_2O_2$, oxygen atoms, oxygen plasma, oxygen radicals, or combinations thereof. Additionally, in some embodiments the first and second vapor phase precursors may be provided in any order as can be readily determined by one of skill in the art. In some embodiments the first and second vapor phase precursors may be provided together or at least in partially overlapping pulses, such as in a CVD process.

In some embodiments a metallic material may be deposited or formed on chamber surfaces by a vapor deposition process, for example by a chemical vapor deposition (CVD), or atomic layer deposition (ALD) process. In some embodiments a metallic material may comprise antimony, for example elemental antimony. In some embodiments the passivation layer may be formed by a plasma enhanced ALD (PEALD) process. In some embodiments a deposition process for forming the passivation layer may comprise between 1 and 10,000 deposition cycles, between 5 and 5,000 deposition cycles, between 10 and 2,500 deposition cycles, or between 10 and 50 deposition cycles.

In some embodiments the metallic material may then be oxidized to form a metal oxide passivation layer. In some embodiments the metallic material may be oxidized by exposing the metallic material to an oxygen reactant. In some embodiments the oxygen reactant may comprise oxygen, oxygen atoms, oxygen radicals, oxygen plasma, or combinations thereof. For example, in some embodiments an oxygen reactant may comprise $O_3$, $H_2O$, $H_2O_2$, oxygen atoms, oxygen plasma, oxygen radicals, or combinations thereof. In some embodiments the metallic material may be subjected to an oxidation process that comprises at least one step of exposing the metallic material to an oxidant, or oxygen reactant. In some embodiments an oxidation process may comprise exposing the metallic material to two or more oxidants or oxygen reactants in two or more steps. In some embodiments the two or more oxidants or oxygen reactants may be different oxidants or oxygen reactants. In some embodiments the two or more exposure steps may be separated by a purge or oxidant removal step. In some embodiments exposing the metallic material to more than one oxidant or oxygen reactant may desirably result in a greater amount of oxidation of the metallic material than exposure to one oxidant or oxygen reactant.

In some embodiments the passivation layer may be formed on the chamber surfaces by oxidizing metallic material that has been deposited on the chamber surfaces during a prior deposition process. In some embodiments where selective deposition step 14 has previously been carried out in a reaction chamber, the reaction chamber passivation step 11 may comprise oxidizing any metallic material deposited on chamber surfaces during the selective deposition step 14 to for a metal oxide passivation layer. In some embodiments the metallic material may be oxidized by exposing the metallic material to an oxygen precursor. In some embodiments the oxygen precursor may comprise oxygen, oxygen atoms, oxygen radicals, oxygen plasma, or combinations thereof.

For example W deposited on the chamber surfaces during a prior W selective deposition process may be oxidized to form a chamber passivation layer. In some embodiments a metallic material is deposited on the chamber surfaces by a deposition process that is not used to deposit material on a substrate or wafer in the reaction chamber.

Silicon Containing Surface Treatment

As shown in FIG. 1 and in some embodiments, the silicon containing material on which deposition is to be avoided can be treated at step 12. For example, in some embodiments the silicon containing material may be treated after a surface cleaning and prior to deposition. In some embodiments, a silicon containing surface can be treated to enhance the selectivity of the deposition process by decreasing the amount of material deposited on the silicon containing surface, for example by passivating the silicon containing surface. In some embodiments the treatment is intended to restore the silicon containing layer and not to block deposition on the silicon containing layer.

In some embodiments the silicon containing surface is a low-k surface, which has been outgassed to remove moisture absorbed from the atmosphere.

In some embodiments the treatment of the silicon containing material is a dielectric restoration step. Different kinds of silicon containing material restoration steps can be performed before the selective deposition and after the surface has been cleaned (if carried out).

In some embodiments the silicon containing surface is treated by contacting the silicon containing surface with one or more silanes, such as disilane. In some embodiments the silicon containing surface is treated with trimethylchlorosilane $(CH_3)_3SiCl$ (TMCS) or with other type of alkylhalosilanes having formula $R_{3-x}SiX_x$, wherein x is from 1 to 3 and each R can independently be selected to be C1-C5 hydrocarbon, such as methyl, ethyl, propyl or butyl, preferably methyl, and X is halide, preferably chloride. U.S. Pat. No. 6,391,785 discloses various surface modifications and treatments and is incorporated herein in its entirety. In some embodiments any of the surface modifications or treatments disclosed in U.S. Pat. No. 6,391,785 can be used in the methods disclosed herein.

In some embodiments the silicon containing surface is contacted with, for example, trimethyl(dimethylamino)silane. In some embodiments the silicon containing surface is contacted with an alkylaminosilane having the formula $(R^I)_3Si(NR^{II}R^{III})$, wherein $R^I$ is a linear or branched C1-C5 alkyl group or a linear or branched C1-C4 alkyl group, $R^{II}$ is a linear or branched C1-C5 alkyl group, a linear or branched C1-C4 alkyl group, or hydrogen, and $R^{III}$ is a linear or branched C1-C5 alkyl group or a linear or branched C1-C4 alkyl group.

In some embodiments the silicon containing surface is contacted with a silane having the general formula $(R^I)_3SiA$, wherein $R^I$ is a linear or branched C1-C5 alkyl group or a linear or branched C1-C4 alkyl group, and A is any ligand which is reactive with the silicon containing surface. That is, the silane bonds to the surface through ligand A, or ligand A forms an bond to the surface but then ligand A may migrate away from the surface and/or silane.

In some embodiments, the restoration chemical is selected from the silane family and has the chemical formula $Si_nH_{2n+2}$ (n is equal to or greater than 1), or the cyclic silane family and has the chemical formula $Si_nH_{2n}$ (n is equal to or greater than 3). In some embodiments the restoration chemical is a silicon source comprising silane, disilane, or trisilane. In some embodiments the silane is disilane $Si_2H_6$ or trisilane $Si_3H_8$. In some embodiments the silicon source can be selected from silane compounds having the formula: $SiH_xL_y$, where L is a ligand selected from the groups including: alkyl, alkenyl, alkynyl, alkoxide, and amine. In some cases L is a ligand selected from the halide group: F, Cl, Br and I.

In some embodiments a silicon containing surface restoration step is carried out prior to selective deposition by exposing the substrate to one or more restoration chemicals, such as $Si_2H_6$ or TMCS, at a temperature of about room temperature to about 150° C., or about 40° C. to about 130°

C. In some embodiments a silicon containing surface restoration step may be carried out at a temperature of up to about 400° C., from about 25° C. to about 300° C., or from 30° C. to about 250° C. In some embodiments a restoration chemical, such as $Si_2H_6$, is provided to the reaction chamber at a flow rate of about 5 to 100 sccm, or about 30 to 60 sccm. In some embodiments the restoration chemical is provided to the reaction chamber for about 1 to 20 s, or about 1 to 10 s. In some embodiments a restoration chemical, such as TMCS, is provided in pulses. About 1-20 or about 1-10 pulses may be provided, for example with a pulse and purge time of about 1 to 10 seconds each. In some embodiments the silicon containing surface restoration step may take place in a second, separate reaction chamber from the reaction chamber in which deposition may be carried out.

While this step is called a surface restoration step, and the chemicals used are called restoration chemicals, these designations are used herein for simplicity and no particular restorative function is implied. Thus, in some embodiments the treatment and/or chemicals may not fully or even partially restore a silicon containing surface.

If the silicon containing surface is damaged, it may also be restored after selective deposition steps by conducting a surface restoration step.

Some silicon containing materials can have porous structures. In order to avoid diffusion, etching, and other undesirable processes the pores can be sealed or terminated with protective groups prior to beginning the deposition process. Thus, in some embodiments a porous silicon containing material can be treated to seal the pores or terminate with a protective group prior to beginning the selective deposition. In some embodiments the porous silicon containing material is treated prior to providing a metal reactant.

In some embodiments pores may be sealed by forming $Si(R^I)_3$ groups on the silicon containing surface, wherein $R^I$ may be a linear or branched C1-C5 alkyl group or a linear or branched C1-C4 alkyl group. In some embodiments the pores are sealed via silylation, i.e., forming —$Si(CH_3)_3$ groups on the silicon containing surface, for example a low-k or $SiO_2$ surface. Etching can in part be avoided by silylation prior to introducing metal fluoride or other reactants. Silylation can also be used to block the pores to avoid reactant penetration into the silicon containing material. In some embodiments silylation is accomplished through the reaction of a silicon compound, for instance Cl—$Si(CH_3)_3$, with an Si—OH terminated surface of a silicon containing material: Si—OH+Cl—$Si(CH_3)_3 \rightarrow$ Si—O—$Si(CH_3)_3$+HCl. Thus, in some embodiments an appropriate surface termination is formed prior to providing the silicon compound. Also the use of silicon compounds with longer carbon containing ligands is possible.

Methods for sealing the pores are disclosed, for example, in U.S. Pat. No. 6,759,325. The disclosure of sealing methods in U.S. Pat. No. 6,759,325 is hereby incorporated by reference in its entirety.

In some embodiments an organic layer can be formed by ALD on the silicon containing material prior to deposition to block the pores and to make the silicon containing surface more resistant to metal fluorides.

In some embodiments where the selectivity is imperfect or a higher selectivity is desired, the surface can be treated after selective deposition, for example using an isotropic selective metal etch, to remove material from the insulator surface without fully removing material from the metallic surface. For example, HCl vapor or a wet etch can be used.

First Metallic Surface Treatment

As shown in FIG. 1 and according to some embodiments the substrate surface may optionally be cleaned at step 13. For example, for embodiments when the first material is copper, the copper surface can be cleaned or reduced such that pure elemental copper is on the substrate surface. In some embodiments a first surface treatment process may remove any organic material present on the first metallic surface. For example a first surface treatment process may remove a passivation layer present on the first metallic surface. For example, the first surface treatment process may remove a benzotriazole (BTA) passivation layer from a copper surface. In some embodiments the first surface treatment process may reduce the first metallic surface of the substrate. In some embodiments the first surface treatment process may remove any native oxide that may be present on the first metallic surface. In some embodiments the first surface treatment process may remove any hydrocarbon layer that may be present on the first metallic surface. In some embodiments the first surface treatment process may provide active sites on the first metallic surface. The first surface treatment process can be done in any of a variety of methods, for example using a chemical such as citric acid or using plasma. For example, the substrate surface may be cleaned using hydrogen containing plasma or radicals, such as H-plasma or $NH_3$-plasma. In some embodiments HCl treatment is used as the first surface treatment method. In some embodiments the first surface treatment process comprises exposing the substrate to a treatment reactant, for example formic acid. Other first surface treatment methods are also possible. The specific first surface treatment method to be used in any particular case can be selected based on a variety of factors such as the materials and the deposition conditions, including, for example, the types of materials on the substrate surface.

In some cases a first material on which selective deposition is desired, such as copper, is passivated. The passivation may be the result of an intentional treatment of the substrate to form the passivation layer, or may result from the processing conditions, such as exposure to oxygen during transport of the substrate.

The surface(s) of the substrate may be passivated, for example, prior to transfer from one reaction space to another. In some embodiments the surface of the first material may be passivated against oxidation in air using any of a variety of known passivation chemicals. In some embodiments in which selective deposition on Cu is desired, the Cu surface may be passivated, for example with BTA. This passivation can be removed with the first surface treatment methods described herein.

In some embodiments the first surface treatment process comprises exposing the substrate to a treatment reactant. In some embodiments the treatment reactant is a vapor phase organic reactant. In some embodiments the treatment reactant may contain at least one alcohol group and may be preferably selected from the group consisting of primary alcohols, secondary alcohols, tertiary alcohols, polyhydroxy alcohols, cyclic alcohols, aromatic alcohols, and other derivatives of alcohols.

Preferred primary alcohols have an —OH group attached to a carbon atom which is bonded to another carbon atom, in particular primary alcohols according to the general formula (I):

$$R^1\text{—OH} \qquad (I)$$

wherein $R^1$ is a linear or branched $C_1$-$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

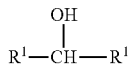  (II)

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

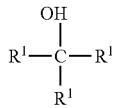  (III)

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain.

Preferred treatment reactants containing at least one aldehyde group (—CHO) are selected from the group consisting of compounds having the general formula (V), alkanedial compounds having the general formula (VI), and other derivatives of aldehydes.

Thus, in one embodiment preferred treatment reactants are aldehydes having the general formula (V):

$R^3$—CHO (V)

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred treatment reactants are aldehydes having the general formula (VI):

OHC—$R^4$—CHO (VI)

wherein $R^4$ is a linear or branched $C_1$-$C_{20}$ saturated or unsaturated hydrocarbon. Alternatively, the aldehyde groups may be directly bonded to each other ($R^4$ is null).

Preferred treatment reactants containing at least one —COOH group are preferably selected from the group consisting of compounds of the general formula (VII), polycarboxylic acids, and other derivatives of carboxylic acids.

Thus, in one embodiment preferred treatment reactants are carboxylic acids having the general formula (VII):

$R^5$—COOH (VII)

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. In some embodiments, $R^5$ is a linear or branched $C_1$-$C_3$ alkyl or alkenyl group. Examples of preferred compounds according to formula (VII) are formic acid, propanoic acid and acetic acid, most preferably formic acid (HCOOH).

In some embodiments the first surface treatment process is a process as described in U.S. patent application Ser. No. 14/628,799, entitled "REMOVAL OF SURFACE PASSIVATION", which is hereby incorporated by reference in its entirety.

In some embodiments, the first metallic surface of the substrate is subjected to a first surface treatment process comprising exposing the substrate to a plasma. Such a first surface treatment process may, for example, remove a passivation layer present on a first metallic surface, such as a Cu surface.

In some embodiments the first surface treatment process comprises exposing the substrate to a plasma consisting only of Ar. In some embodiments an Ar and H-containing plasma is used in the first surface treatment process. In some embodiments an Ar and H and N-containing plasma is used in the first surface treatment process. It may be noted that instead of Ar, other noble gases, such as He, Ne, Kr or Xe can be used in substantially same conditions. In some embodiments more than one type of plasma may be used. For example, one or more of Ar-containing plasma, Ar and H-containing plasma and Ar, H and N-containing plasma may be provided. In some embodiments all three types of plasma are provided consecutively.

In some embodiments a plasma generated from $H_2$ can be used in the first surface treatment process. In some embodiments a plasma generated from ethanol can be used in the first surface treatment process. In some embodiments a plasma generated from a source containing both $H_2$ and ethanol may be used in the first surface treatment process. In some embodiments, for example where the first metallic surface is a Cu surface a plasma generated from $H_2$, ethanol, or $H_2$ and ethanol is preferably used in the first surface treatment process.

In some embodiments a plasma generated from $NH_3$ can be used in the first surface treatment process. In some embodiments a plasma generated from $NH_3$ and $H_2$ can be used in the first surface treatment process. In some embodiments, for example where the first metallic surface is a Co surface a plasma generated from $NH_3$ and $H_2$ is preferably used in the first surface treatment process. In some embodiments a plasma may be generated from a gas comprising $NH_3$ and $H_2$ where the ratio of $NH_3$ to $H_2$ is from about 1:100 to about 1:1, preferably from about 1:5 to about 1:20. In some embodiments the ratio of $NH_3$ to $H_2$ may be about 1:19, about 1:9, or about 1:5.

In some embodiments the first surface treatment process may comprise exposing the substrate to a first treatment reactant followed by exposure to a second treatment reactant. In some embodiments the first treatment reactant may comprise $O_3$, atomic oxygen, oxygen radicals, or oxygen plasma. In some embodiments the second treatment reactant may comprise atomic hydrogen, hydrogen radicals, or hydrogen plasma. In some embodiments the first treatment reactant may be removed from the reaction chamber prior to introducing the second treatment reactant. In some embodiments exposure to the first treatment reactant may occur in a first reaction chamber and exposure of the substrate to the second treatment reactant may occur in a second reaction chamber.

In some embodiments the first treatment reactant may remove any organic passivation layer or hydrocarbons that may be present on the first metallic surface while the second treatment reactant may reduce the first metallic surface. For example, in some embodiments where the first metallic surface is a Co surface, exposure to $O_3$ may remove a naturally occurring hydrocarbon layer from the Co surface while subsequent exposure to H radicals may reduce the Co surface.

In some embodiments utilizing Ar-containing plasma, Ar may be provided, for example, from about 1 to about 3000 sccm, more preferably from about 300 to about 1500 sccm, and most preferably from about 1000 to about 1300 sccm. In some embodiments utilizing H-containing plasma, $H_2$ may be provided, for example, from about 1 to about 500 sccm, more preferably from about 10 to about 200 sccm, and most preferably from about 30 to about 100 sccm. In some embodiments utilizing N-containing plasma, $N_2$ or $NH_3$ may be provided, for example, at about from about 1 to about 500 sccm, more preferably from about 5 to about 200 sccm, and most preferably from about 5 to about 30 sccm. Similar conditions can be used for other types of plasma, for example ethanol or O-containing plasma.

In some embodiments plasma may be generated at a power of less than about 1500 Watts, for example about 1 to about 1000 Watts, about 1 to about 500 W, or about 1 to about 200 W or less. In some embodiments the plasma or treatment reactant is provided for less than about 200 s, for example about 180 s or less, about 60 s or less, or about 30 s or less. In some embodiments exposure of the substrate to a plasma or reactant can be continuous, or split into several pulses. The number of necessary pulses is determined by the length of each of the pulses used to reach the require total exposure time as determined by the skilled artisan.

Temperature during the surface treatment may be, for example, from about room temperature to about 400° C., from about 100° C. to about 400° C., or from about 100° C. to about 130° C. In some embodiments the substrate may be subjected to an outgassed in order to remove, for example, moisture from the substrate surface of inside the silicon containing material. In some embodiments the substrate may be outgassed prior to subjecting the substrate to a first surface treatment process.

In some embodiments, conditions for surface first surface treatment are selected such that etching of the silicon containing surface is avoided or minimized.

Selective Deposition

First Precursor

In some embodiments a first precursor is provided to the substrate such that a layer is selectively formed on a first metal surface of the substrate relative to a second silicon containing surface of the substrate. In some embodiments the first precursor preferably comprises silicon or boron. In some embodiments a 0.05-4 nm thick layer of Si or B is formed on the metal surface of the substrate. In some embodiments a 0.1-2 nm thick layer of Si or B is formed on the metal surface of the substrate. In some embodiments less than 1 nm of Si or B can be used. Without being bound to a theory, it is believed that the metal surface on the substrate can catalyze or assist in the adsorption or decomposition of the first precursor in comparison to the reactivity of the second surface. In some embodiments the formation of silicon or boron on the metal surface is self-limiting, such that up to a monolayer is formed upon exposure to the reactant. In some embodiments the silicon or boron source chemical can decompose on the copper or metal surface.

In some embodiments, the silicon source chemical is selected from the silane family $Si_nH_{2n+2}$ (n is equal to or greater than 1) or the cyclic silane family $Si_nH_{2n}$ (n is equal to or greater than 3). In some embodiments the silicon source comprises silane or disilane. Most preferably the silane is disilane $Si_2H_6$ or trisilane $Si_3H_8$. In some embodiments the silicon source can be selected from silane compounds having the formula: $SiH_xL_y$, where L is a ligand selected from the groups including: alkyl, alkenyl, alkynyl, alkoxide, and amine. In some cases L is a ligand selected from the halide group: F, Cl, Br and I.

In some embodiments the first precursor comprises boron. In some embodiments the first precursor is diborane ($B_2H_6$). Diborane has similar properties to some of the silane based compounds. For example, diborane has a lower decomposition temperature than disilane but similar thermal stability to trisilane (silcore).

Other precursors comprising boron could also be used. The availability of a vast number of boron compounds makes it possible to choose one with the desired properties. In addition, it is possible to use more than one boron compound. Preferably, one or more of the following boron compounds is used:

Boranes according to formula I or formula II.

$$B_nH_{n+x}, \qquad (I)$$

Wherein n is an integer from 1 to 10, preferably from 2 to 6, and x is an even integer, preferably 4, 6 or 8.

$$B_nH_m \qquad (II)$$

Wherein n is an integer from 1 to 10, preferably form 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N$—$BH_3$ can be used.

Borane halides, particularly fluorides, bromides and chlorides. An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

Halogenoboranes according to formula III.

$$B_nX_n \qquad (III)$$

Wherein X is Cl or Br and n is 4 or an integer from 8 to 12 when X is Cl, or n is an integer from 7 to 10 when X is Br.

Carboranes according to formula IV.

$$C_2B_nH_{n+x} \qquad (IV)$$

Wherein n is an integer from 1 to 10, preferably from 2 to 6, and x is an even integer, preferably 2, 4 or 6.

Examples of carboranes according to formula IV include closo-carboranes ($C_2B_nHd$), nido-carboranes ($C2B_nH_{n+4}$) and arachno-carboranes ($C_2B_nH_{n+6}$).

Amine-borane adducts according to formula V.

$$R_3NBX_3 \quad (V)$$

Wherein R is linear or branched C1 to C10, preferably C1 to C4 alkyl or H, and X is linear or branched C1 to C10, preferably C1 to C4 alkyl, H or halogen.

Aminoboranes where one or more of the substituents on B is an amino group according to formula VI.

$$R_2N \quad (VI)$$

Wherein R is linear or branched C1 to C10, preferably C1 to C4 alkyl or substituted or unsubstituted aryl group.

An example of a suitable aminoborane is $(CH_3)_2NB(CH_3)_2$.

Cyclic borazine ($-BH-NH-$)$_3$ and its volatile derivatives.

Alkyl borons or alkyl boranes, wherein the alkyl is typically linear or branched C1 to C10 alkyl, preferably C2 to C4 alkyl.

In some embodiments the first precursor comprises germanium. In some embodiments, the germanium source chemical is selected from the germane family $Ge_nH_{2n+2}$ (n is equal to or greater than 1) or the cyclic germane family $Ge_nH_{2n}$ (n is equal to or greater than 3). In some preferred embodiments the germanium source comprises germane $GeH_4$. In some embodiments the germanium source can be selected from germane compounds having the formula: $GeH_xL_y$, where L is a ligand selected from the groups including: alkyl, alkenyl, alkynyl, alkoxide, and amine. In some cases L is a ligand selected from the halide group: F, Cl, Br and I.

Metal Source Chemicals

Preferably the second reactant comprises a metal. In some embodiments the metal is a transition metal. The transition metal can be selected from the group of: Ti, V, Cr, Mn, Nb, Mo, Ru, Rh, Pd, Ag, Hf, Ta, W, Re, Os, Ir and Pt. In some embodiments the second reactant comprises W, Ta, Nb, Ti, Mo or V. In some embodiments the second reactant preferably comprises tungsten.

In some embodiments the second reactant comprises a noble metal. The noble metal can be selected from the group: Au, Pt, Ir, Pd, Os, Ag, Rh, and Ru.

In some embodiments the second reactant comprises a metal halide (F, Cl, Br, I). In some preferred embodiments the second reactant comprises a transition metal halide. In some embodiments the second reactant preferably comprises fluorine. In some embodiments, the second reactant comprises $WF_6$, $TaF_5$, $NbF_5$, $TiF_4$, $MoF_x$, $VF_x$. In some embodiments the second reactant comprises $WF_6$.

The second reactant can be used to form a variety of different materials on the substrate. In some embodiments the second reactant reacts with the first reactant on the substrate to form a metallic material on the substrate. Any of the metals disclosed above for the second reactant can be in the film deposited on the substrate.

In some embodiments an elemental metal film can be formed, for example a W film. In some embodiments a metal nitride film can be formed. In some embodiments a metal silicide film can be formed.

In some embodiments a metallic or elemental metal film is first formed through reaction of the Si or B on the substrate surface and the second reactant and later converted to a corresponding metal silicide or metal nitride through further processing. For example, the first metallic or elemental metal film may be exposed to a third reactant to convert it to a metal silicide or metal nitride.

In some embodiments further processing of the metallic material can be done to dope the metallic material or convert the metallic material to a metal nitride or metal silicide. In some embodiments, for example, the material can be converted to a corresponding metal nitride using plasma or a $NH_3$-treatment. In some embodiments an electrically conductive metallic material can be converted to a more electrically resistive material or to a dielectric material by using different treatments and depending on the starting metallic material.

In some embodiments multiple pulses of one of the reactants can be provided prior to providing the next reactant. In some embodiments, any excess reactants can be removed prior to the provision of the next reactant. In some embodiments the process chamber can be purged prior to provision of the next reactant.

In some embodiments vapor phase precursors can be provided to the reaction space with the aid of an inert carrier gas. Removing excess reactants can include evacuating some of the contents of the reaction space or purging the reaction space with helium, nitrogen or any other inert gas. In some embodiments purging can comprise turning off the flow of the reactive gas while continuing to flow an inert carrier gas to the reaction space.

Deposition Temperature

In some embodiments the temperature is selected to facilitate the selective deposition. Deposition is generally defined as selective if the amount of the deposited material per surface area or volume (e.g. $at/cm^2$ or $at/cm^3$) on the first surface is greater than the amount of the deposited material per surface area or volume on the second surface. The amount of material deposited on the surfaces can be determined by measuring the thicknesses of each layer. In some cases, the thickness measurement might not be possible due to non-continuous film. In some cases the selectivity can be determined by measuring the deposited atoms per surface area or volume. As mentioned above, the selectivity can be expressed as the ratio of material formed on the first surface to amount of material formed on the first and second surfaces combined. Preferably, the selectivity is above about 70%, above about 80%, more preferably above 90%, even more preferably above 95%, and most preferably about 100%. In some cases selectivity above 80% may be acceptable for certain applications. In some cases selectivity above 50% may be acceptable for certain applications.

In some embodiments the deposition temperature is selected such that the selectivity is above about 90%. In some embodiments, the deposition temperature is selected such that a selectivity of about 100% is achieved.

In some embodiments, the deposition temperature is selected such that the first precursor comprising silicon or boron forms a layer containing silicon or boron on the first metal surface. In some embodiments the first precursor does not form a layer on the second surface comprising silicon, or forms a less than a complete layer on the second surface.

The particular temperature utilized can depend, in part, on the silicon or boron precursor that is selected along with the first surface or metal and the second surface or dielectric on the substrate. Preferably, the silicon or boron source forms on the first metal surface instead of the second surface comprising silicon to form a layer comprising silicon or boron. Preferably, the layer comprising silicon or boron is about a monolayer or less. In some cases, more than a monolayer of silicon or boron can be formed. In some embodiments a layer of silicon or boron with a thickness of from about 0.05 nm to about 4 nm is formed on the metal surface of the substrate. In some embodiments preferably a layer of silicon or boron with a thickness of from about 0.1 nm to about 2 nm is formed on the metal surface of the substrate. In some embodiments the formation of silicon or boron on the metal surface is self-limiting. In some embodiments the layer comprising silicon or boron is formed by decomposition.

In some cases the silicon or boron layer can form on both the metal and silicon containing surfaces at higher temperatures. In such situations, the use of lower temperatures is preferred because the silicon or boron can form on the metal surface at a lower temperature than the surface comprising silicon. Thus, the temperature can be selected such that the silicon precursor interacts preferentially with the first surface or metal surface relative to the second surface or silicon containing surface.

In some embodiments deposition temperatures are selected to achieve the desired level of selectivity. For example, a temperature can be selected such that absorption of the silicon or boron containing precursor to the low-k material is limited to an amount necessary to achieve a desired level of selectivity.

The deposition temperature can be selected based on the silicon or boron source and the particular substrate surfaces that are used (e.g. silicon containing surface and copper surface).

In some embodiments the deposition temperature is preferably less than 200° C., more preferably less than about 175° C., more preferably less than about 150° C., most preferably less than about 110° C. In some cases temperatures of less than about 100° C. can be used. In some embodiments the deposition temperature range for selective deposition having selectivity of over 50% in films having thicknesses of less than about 5 nm (e.g. deposited W thickness) deposited using disilane and $WF_6$ is from about 30° C. to about 200° C. In some embodiments desirable levels of uniformity and selectivity can be achieved using deposition temperature ranges from about 30° C. to about 110° C. In some embodiments desirable levels of uniformity and selectivity can be achieved using deposition temperature ranges from about 40° C. to about 110° C. In some embodiments desirable levels of uniformity and selectivity can be achieved using deposition temperatures ranges less than about 100° C. In these temperature ranges a person skilled in the art can optimize the process to achieve desired or acceptable uniformity and selectivity for the films deposited using a particular reactor with particular precursors.

In some embodiments the silicon or boron-containing precursor and the second metal precursor are provided at the same temperature and in the same reaction space. In some embodiments the silicon precursor is provided at a first deposition temperature and the second metal reactant is provided at a second deposition temperature. In practice, this may mean providing the first reactant in a first reaction space and providing the second metal reactant in a second reaction space.

In some embodiments using disilane and depositing tungsten using $WF_6$ on a copper or cobalt surface, a selectivity of more than about 80%, preferably more than about 90%, relative to a surface comprising silicon can be achieved with a deposition temperature of from about 30° C. to about 110° C. The deposition temperature for trisilane can be even lower than the deposition temperature for disilane. In the above mentioned embodiments the deposited film may be, for example and without limitation, a tungsten film.

In some embodiments the thickness of the film that is selectively deposited is less than about 10 nm, less than about 5 nm, about 4 nm or less or, in some embodiments, from about 1 nm to about 4 nm. However, in some cases a desired level of selectivity, for example more than 50%, more preferably more than 80%, is achieved with the thicknesses of the selectively deposited film being over about 10 nm.

In some embodiments a W film having a thickness of about 10 nm or less is deposited selectively over Cu of Co on a substrate surface with a selectivity of greater than 50% relative to a silicon containing material.

In some embodiments a W film having a thickness of about 5 nm or less is deposited selectively over Cu or Co on a substrate surface with a selectivity of greater than about 80% relative to a silicon containing material.

In some embodiments a W film having a thickness of about 3 nm or less is deposited selectively over Cu or Co on a substrate surface with a selectivity of greater than about 90% relative to a silicon containing material.

If a lower selectivity is preferred the temperature can be slightly higher than the temperature for processes that achieve more than 90% selectivity.

In some embodiments, deposition conditions and/or reactants are selected such that etching of the silicon containing surfaces is avoided or minimized. For example, at higher temperatures metal fluorides can start fluorinating any Si—OH groups that may be present on the second surface and in some cases they can etch the silicon containing surface. Thus in some embodiments the deposition temperature is selected so that etching of silicon containing surface is avoided or eliminated.

The substrate temperature during the provision of the second reactant can be the same as the temperature during the provision of the silicon or boron containing reactant. In other embodiments, different temperatures may be used.

In embodiments where $WF_6$ is used as the second reactant with disilane as the first reactant a temperature of from about 30° C. to about 110° C. can be used.

In some embodiments, the temperature of the substrate can be increased when providing the second reactant to increase the conversion of the metal reactant. For example, a higher temperature can be used when $TaF_5$ and $NbF_5$ are used as the second reactant. For example, when using $TaF_5$ the temperatures can be over about 300° C. When using $NbF_5$ the temperature can be above about 250° C. This can be accomplished by heating the substrate, using a higher reaction temperature for the second material or other means known to the skilled artisan.

Exemplary Process Flows

Figure 2:
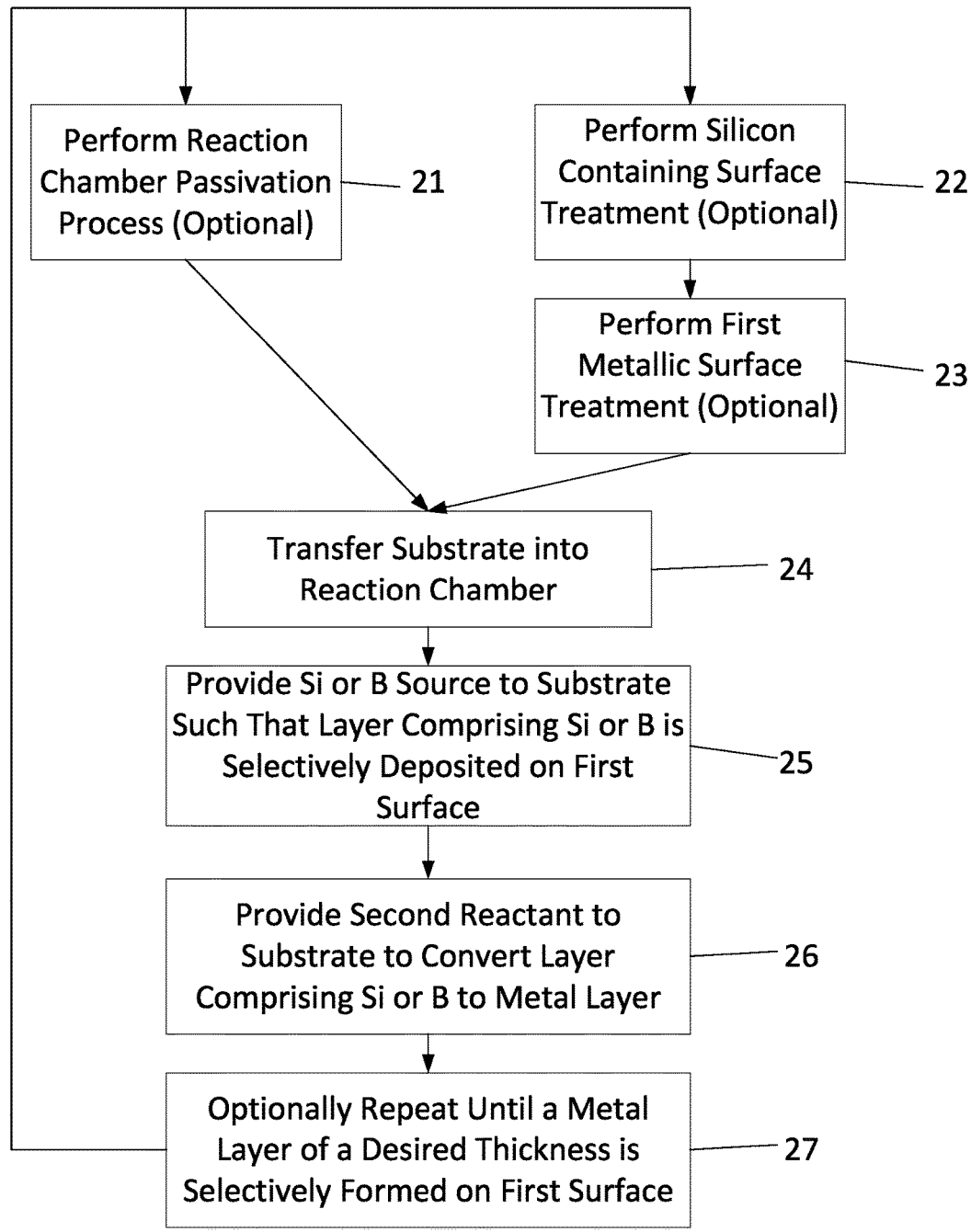
FIG. 2 is a flow chart illustrating a process for selectively depositing a metal film on a first metallic surface of a substrate relative to a second silicon containing surface according to certain embodiments.

FIG. 2 is a flow chart generally illustrating a process 20 for selectively depositing a metal film on a first metallic surface of a substrate relative to a second silicon containing surface according to certain embodiments. The reaction chamber or chambers in which a selective deposition process will be performed are first subjected to an optional reactor passivation process at step 21 to deposit a SiN passivation layer on any chamber surfaces which connect directly with the location of a subsequent selective deposition process. A substrate comprising a first metallic surface, such as a Co surface and second surface comprising silicon, such as a $SiO_2$ surface is provided and is optionally outgassed. In some embodiments the substrate may be subjected to an optional silicon-containing surface treatment at step 22, for example to passivate the $SiO_2$ surface. The substrate may then be subjected to an optional first surface treatment process at step 23. As described above, in some embodiments the first surface treatment process may comprise exposing the substrate to a plasma, for example a plasma generated from $NH_3$, $H_2$, or a combination of the two.

In some embodiments the plasma treatment process 23 may reduce the first Co surface. In some embodiments the plasma treatment process may remove a native oxide layer present on the first Co surface. In some embodiments the plasma treatment process may remove a passivation or hydrocarbon layer, for example a BTA layer, that may be present on the first Co surface.

In some embodiments steps 22 and 23 may be carried out in a different reaction chamber or chambers from the reaction chamber being passivated at step 21. That is, steps 22 and 23 may be carried out in a different reaction chamber or chambers than the reaction chamber in which a subsequent selective deposition process is to be carried out in. Further, in some embodiments the reaction chamber passivation step 21 may proceed concurrently with one or more of steps 22 and 23.

In some embodiments the substrate surface is optionally further annealed in an inert atmosphere after optional step 23. The annealing is carried out at a temperature that is higher than the temperature during steps 22, 23, or the following selective deposition steps 25-27. The temperature for the annealing process is preferably from about 150° C. to about 400° C., from about 150° C. to about 300° C., or from about 200° C. to about 275° C. and in some cases at about 250° C. In some embodiments the substrate surface may optionally be further annealed in a $NH_3$ environment in order to create $NH_x$-surface terminations on any cobalt oxide present on the first Co surface.

Next, at step 24, the substrate is transferred into the chamber which was optionally passivated at step 21 and a silicon or boron source is provided to the substrate, such that a silicon or boron containing species is deposited on the Co surface at step 25. In some embodiments the silicon source is disilane. In some embodiments, the disilane can be selectively decomposed on the Co surface relative to the $SiO_2$ surface using a deposition temperature at which the silicon precursor forms silicon on the Co surface but does form silicon on the $SiO_2$ surface. For example the deposition may be from about 30° C. to about 110° C. In some embodiments, the silicon or boron source reacts with the Co surface in a self-limiting manner. It is believed that the Co surface can facilitate the formation of silicon relative to the formation on the $SiO_2$ surface.

In some embodiments a layer comprising silicon or boron with a thickness of from about 0.05 nm to about 4 nm is formed on the Co surface of the substrate in each deposition cycle. In some embodiments a layer comprising silicon or boron with a thickness of from about 0.1 nm to about 2 nm is formed on the Co surface of the substrate in each cycle. In preferred embodiments the formation of a layer comprising silicon or boron on the metal surface is self-limiting. Thus, at most a monolayer comprising silicon or boron is formed in each cycle.

After the silicon or boron containing layer is formed on the Co layer a second reactant, such as a metal halide, for example $WF_6$, is used to convert the layer comprising silicon or boron to a layer comprising the corresponding metal from the second reactant, such as tungsten, at step 26. In some embodiments, $WF_6$, $TaF_5$, $NbF_5$ or other compounds that are able to react with the Si or B layer are introduced to the substrate surface to form a metallic layer or metal silicide. In some embodiments, the silicon or boron precursor (e.g. disilane) and second reactant (such as metal halide) pulses can be repeated at step 27 until a metallic layer with a desired thickness is formed. In some embodiments the metallic layer is an elemental metal, for example W. In some embodiments, the metallic layer can include additional elements, such as Si, B, N, and other dopants. In some embodiments the metallic layer is further treated to form a different material. For example an elemental metal layer can be treated using a third reactant to form a metal nitride or metal silicide.

A deposition cycle can be defined as providing the silicon or boron precursor and providing the second metal reactant, that is, steps 25 and 26. In some embodiments no other reactants are provided in the deposition cycle. In some embodiments the deposition cycle is repeated to form a W layer with a desired thickness. In some embodiments a W layer with a thickness from about 0.05 nm to about 4 nm is formed in each cycle. In some embodiments, preferably a W layer with a thickness from about 0.1 nm to about 2 nm is formed in each cycle. In some embodiments the W layer has a thickness of about 1-2 nm. In other embodiments the thickness of the deposited W layer is above about 2 nm, in some cases above about 30 nm, and in some cases above about 50 nm. In preferred embodiments the layer has thickness of less than 10 nm.

In some embodiments the deposition cycle is repeated 10 or more times. In some embodiments, the deposition cycle is repeated at least 50 times. In some embodiments the deposition cycle is repeated about 100 times or more. The number of cycles can be selected based on the desired thickness of the W layer.

In some embodiments, no other reactants are provided besides the precursor comprising silicon or boron and the second metal reactant.

In some embodiments the material comprising the first surface, such as cobalt, is not converted or reacted to form another compound during the selective deposition cycle.

In some embodiments, after the one or more deposition cycles are completed a half deposition cycle can be performed at step 28. For example, a silicon or boron precursor pulse or alternatively a second metal reactant can be provided. In some embodiments, after the one or more deposition cycles a silicon or boron precursor pulse is provided. When a silicon or boron precursor pulse (or other metal reactant) is provided, the formed material can form a sacrificial layer of silicon oxide or boron oxide (or a metal oxide) when exposed to air or an oxygen containing atmosphere. The sacrificial layer can prevent the metallic material underneath the silicon oxide or boron oxide layer from oxidizing when exposed to air or an oxygen-containing atmosphere outside the reactor. The formed silicon oxide or boron oxide layer can be removed in further processing steps, for example with a single pulse of metal source chemicals described herein, preferably with $WF_6$, $TaF_5$, $NbF_5$, $TiF_4$, $MoF_x$ or $VF_x$ and more preferably with $WF_6$.

In some embodiments the entire process flow is carried out in a single reaction chamber; for example in a single process module. However, in other embodiments the various steps are carried out in two or more reaction chambers. For example, in some embodiments the first surface treatment and silicon containing surface treatment processes (if used) are carried out in a first reaction chamber while the selective deposition may be carried out in a second, different reaction chamber. In some embodiments the second, different reaction chamber may also be treated to form a passivation layer therein. If the optional heat anneal step is needed or desired, the substrate may then be transported to a second reaction chamber where the heat anneal (if used) and selective deposition are carried out. In some embodiments the anneal step is carried out in a second reaction chamber, and the substrate is transported back to the first reaction chamber, or to a third reaction chamber where selective deposition is carried out. In some embodiments the first surface treatment and silicon containing surface treatment (if used) are carried out in first reaction chamber and the selective deposition is carried out in a second, different reaction chamber without the heat anneal step in between the first surface treatment and depositions step. The substrate may be cooled down for a period of time prior to transport, if required. In some embodiments, the cool down is carried out for about 0 to 30 min, or about 0 to 10 minutes, at a pressure ranging from vacuum to about 2 atm, or about 0.1 torr to about 760 torr, or about 1 torr to about 760 torr. The substrate may be transported, for example, under vacuum or in the presence of $N_2$ (and possibly some $O_2$) at about 1 to 1000 torr.

Figure 3:
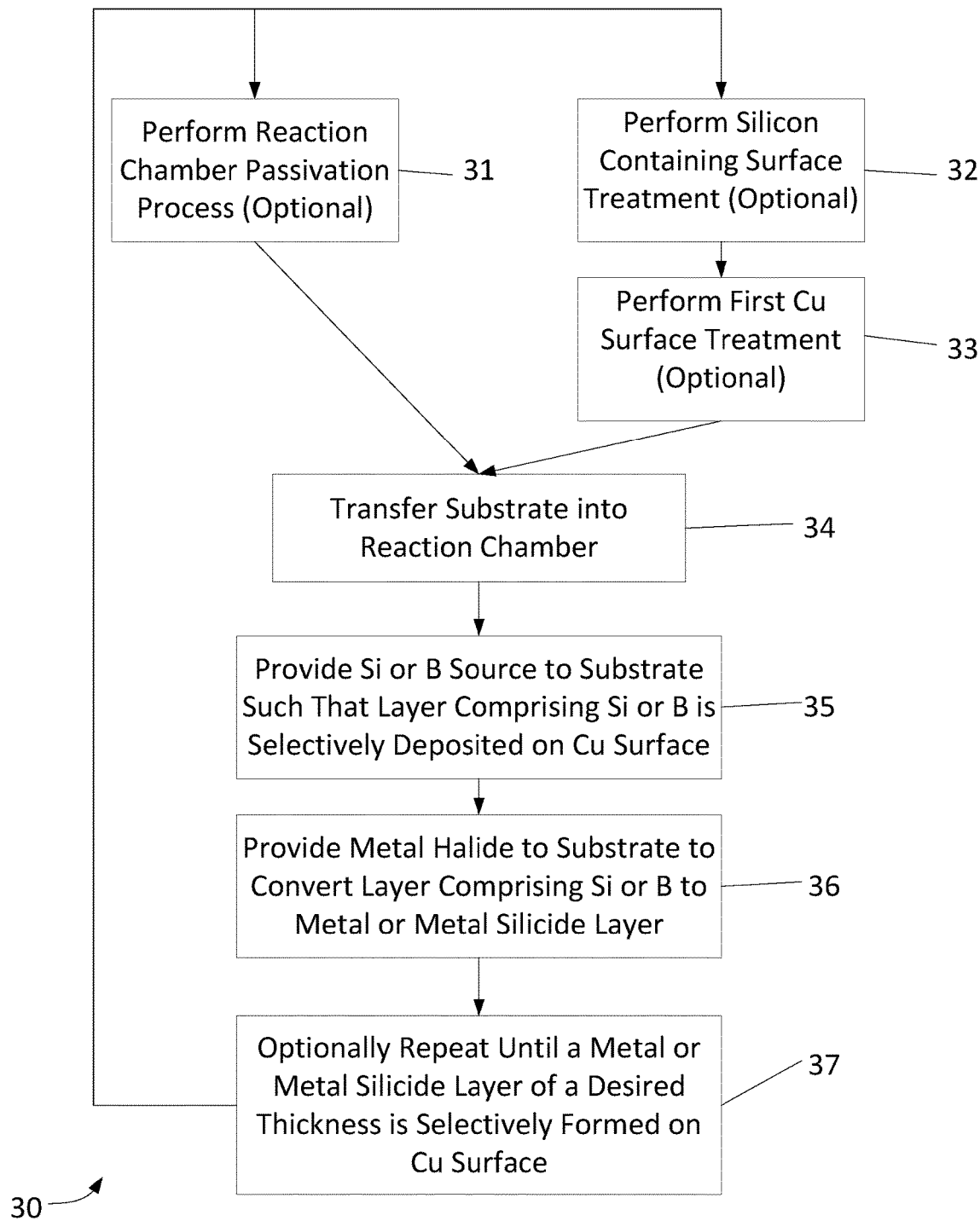
FIG. 3 is a flow chart illustrating a process for selectively depositing a metal film on a first metallic surface of a substrate relative to a second silicon containing surface according to certain other embodiments.

FIG. 3 is a flow chart generally illustrating a process 30 for selectively depositing a metal film on a first metallic surface of a substrate relative to a second silicon containing surface according to certain other embodiments. The reaction chamber or chambers in which a selective deposition process will be performed are first subjected to an optional reactor passivation process at step 31. A substrate comprising a first metallic surface, preferably a Cu surface and second surface comprising silicon, such as a $SiO_2$ surface is provided and is optionally outgassed. In some embodiments the substrate may be subjected to an optional silicon-containing surface treatment at step 32, for example to passivate the $SiO_2$ surface. The substrate may then be subjected to an optional first surface treatment process at step 33. As described above, in some embodiments the surface first surface treatment process may comprise exposing the substrate to one or more first surface treatment reactants.

In some embodiments the treatment process 33 may reduce the first metallic surface. In some embodiments the treatment process may remove a native oxide layer present on the first metallic surface. In some embodiments the treatment process may remove a passivation or hydrocarbon layer that may be present on the first metallic surface, for example the treatment process may remove a BTA layer present on the Cu surface. In some embodiments a passivation layer, for example a BTA layer on the Cu surface may have been deposited to protect the Cu surface from oxidation during other processing steps, for example chemical-mechanical planarization. However, such a passivation layer must be removed prior to the selective deposition process.

In some embodiments the treatment process comprises exposing the substrate to a treatment reactant. In some embodiments the treatment reactant is a vapor phase organic reactant. In some embodiments treatment reactant may contain at least one alcohol group and may be preferably selected from the group consisting of primary alcohols, secondary alcohols, tertiary alcohols, polyhydroxy alcohols, cyclic alcohols, aromatic alcohols, and other derivatives of alcohols. In some embodiments the treatment reactant may comprise formic acid or HCl.

Temperature during the treatment process 33 may be, for example, from about room temperature to about 400° C., from about 100° C. to about 400° C., from about 100° C. to about 130° C., or form about 30° C. to about 110° C.

In some embodiments steps 32 and 33 may be carried out in a different reaction chamber or chambers from the reaction chamber being passivated at step 31. That is, steps 32 and 33 may be carried out in a different reaction chamber or chambers than the reaction chamber in which a subsequent selective deposition process is to be carried out in. Further, in some embodiments the reaction chamber passivation step 31 may proceed concurrently with one or more of steps 32 and 33.

In some embodiments the substrate surface is optionally further annealed in an inert atmosphere after optional step 33. The annealing is carried out at a temperature that is higher than the temperature during steps 32, 33, or the following selective deposition steps 35-37. The temperature for the annealing process is preferably from about 150° C. to about 400° C., from about 150° C. to about 300° C., or from about 200° C. to about 275° C. and in some cases at about 250° C. In some embodiments the substrate surface may optionally be further annealed in a $NH_3$ environment in order to create $NH_x$-surface terminations on an metal oxide present on the Cu surface.

Next, at step 34, the substrate is transferred into the chamber which was optionally passivated at step 31 and a silicon or boron source is provided to the substrate, such that a silicon or boron containing species is deposited on the Cu surface at step 35. In some embodiments the silicon source is disilane. In some embodiments, the disilane can be selectively decomposed on the Cu surface relative to the silicon containing surface using a temperature at which the silicon precursor forms silicon on the Cu surface but does form silicon on the $SiO_2$ surface. In some embodiments, the silicon or boron source reacts with the Cu surface in a self-limiting manner. It is believed that the Cu surface can facilitate the formation of silicon relative to the formation on the $SiO_2$ surface.

In some embodiments a layer comprising silicon or boron with a thickness of from about 0.05 nm to about 4 nm is formed on the Cu surface of the substrate in each deposition cycle. In some embodiments a layer comprising silicon or boron with a thickness of from about 0.1 nm to about 2 nm is formed on the Cu surface of the substrate in each cycle. In preferred embodiments the formation of a layer comprising silicon or boron on the Cu surface is self-limiting. Thus, at most a monolayer comprising silicon or boron is formed in each cycle.

After the silicon or boron containing layer is formed on the Cu surface a second reactant, such as a metal halide, is used to convert the layer comprising silicon or boron to a layer comprising the corresponding metal from the second reactant, such as the metal in the metal halide, at step 36. In some embodiments, $WF_6$, $TaF_5$, $NbF_5$ or other compounds that are able to react with the Si or B layer are introduced to the substrate surface to form a metallic layer or metal silicide. In some embodiments, the silicon or boron precursor (e.g. disilane) and second reactant (such as metal halide) pulses can be repeated at step 37 until a metallic layer with a desired thickness is formed. In some embodiments the metallic layer is an elemental metal, for example W. In some embodiments, the metallic layer can include additional elements, such as Si, B, N, and other dopants. In some embodiments the metallic layer is further treated to form a different material. For example an elemental metal layer can be treated using a third reactant to form a metal nitride or metal silicide.

A deposition cycle can be defined as providing the silicon or boron precursor and providing the second metal reactant, that is, steps 35 and 36. In some embodiments no other reactants are provided in the deposition cycle. In some embodiments the deposition cycle is repeated to form a metallic layer with a desired thickness. In some embodiments a metallic layer with a thickness from about 0.05 nm to about 4 nm is formed in each cycle. In some embodiments, preferably a metallic layer with a thickness from about 0.1 nm to about 2 nm is formed in each cycle. In some embodiments the metallic layer has a thickness of about 1-2 nm. In other embodiments the thickness of the deposited metallic layer is above about 2 nm, in some cases above about 30 nm, and in some cases above about 50 nm. In preferred embodiments the layer has thickness of less than 10 nm.

In some embodiments the deposition cycle is repeated 10 or more times. In some embodiments, the deposition cycle is repeated at least 50 times. In some embodiments the deposition cycle is repeated about 100 times or more. The number of cycles can be selected based on the desired thickness of the metallic layer.

In some embodiments, no other reactants are provided besides the precursor comprising silicon or boron and the second metal reactant.

In some embodiments the material comprising the first surface, such as copper, is not converted or reacted to form another compound during the selective deposition cycle.

In some embodiments, after the one or more deposition cycles are completed a half deposition cycle can be performed at step 38. For example, a silicon or boron precursor pulse or alternatively a second metal reactant can be provided. In some embodiments, after the one or more deposition cycles a silicon or boron precursor pulse is provided. When a silicon or boron precursor pulse (or other metal reactant) is provided, the formed material can form a sacrificial layer of silicon oxide or boron oxide (or a metal oxide) when exposed to air or an oxygen containing atmosphere. The sacrificial layer can prevent the metallic material underneath the silicon oxide or boron oxide layer from oxidizing when exposed to air or an oxygen-containing atmosphere outside the reactor. The formed silicon oxide or boron oxide layer can be removed in further processing steps, for example with a single pulse of metal source chemicals described herein, preferably with $WF_6$, $TaF_5$, $NbF_5$, $TiF_4$, $MoF_x$ or $VF_x$ and more preferably with $WF_6$.

In some embodiments the entire process flow is carried out in a single reaction chamber; for example in a single process module. However, in other embodiments the various steps are carried out in two or more reaction chambers. For example, in some embodiments the first surface treatment and silicon containing surface treatment processes (if used) are carried out in a first reaction chamber while the selective deposition may be carried out in a second, different reaction chamber. In some embodiments the second, different reaction chamber may also be treated to form a passivation layer therein. If the optional heat anneal step is needed or desired, the substrate may then be transported to a second reaction chamber where the heat anneal (if used) and selective deposition are carried out. In some embodiments the anneal step is carried out in a second reaction chamber, and the substrate is transported back to the first reaction chamber, or to a third reaction chamber where selective deposition is carried out. In some embodiments the first surface treatment and silicon containing surface treatment (if used) are carried out in first reaction chamber and the selective deposition is carried out in a second, different reaction chamber without the heat anneal step in between the first surface treatment and depositions step. The substrate may be cooled down for a period of time prior to transport, if required. In some embodiments, the cool down is carried out for about 0 to 30 min, or about 0 to 10 minutes, at a pressure ranging from vacuum to about 2 atm, or about 0.1 torr to about 760 torr, or about 1 torr to about 760 torr. The substrate may be transported, for example, under vacuum or in the presence of $N_2$ (and possibly some $O_2$) at about 1 to 1000 torr.

Figure 4:
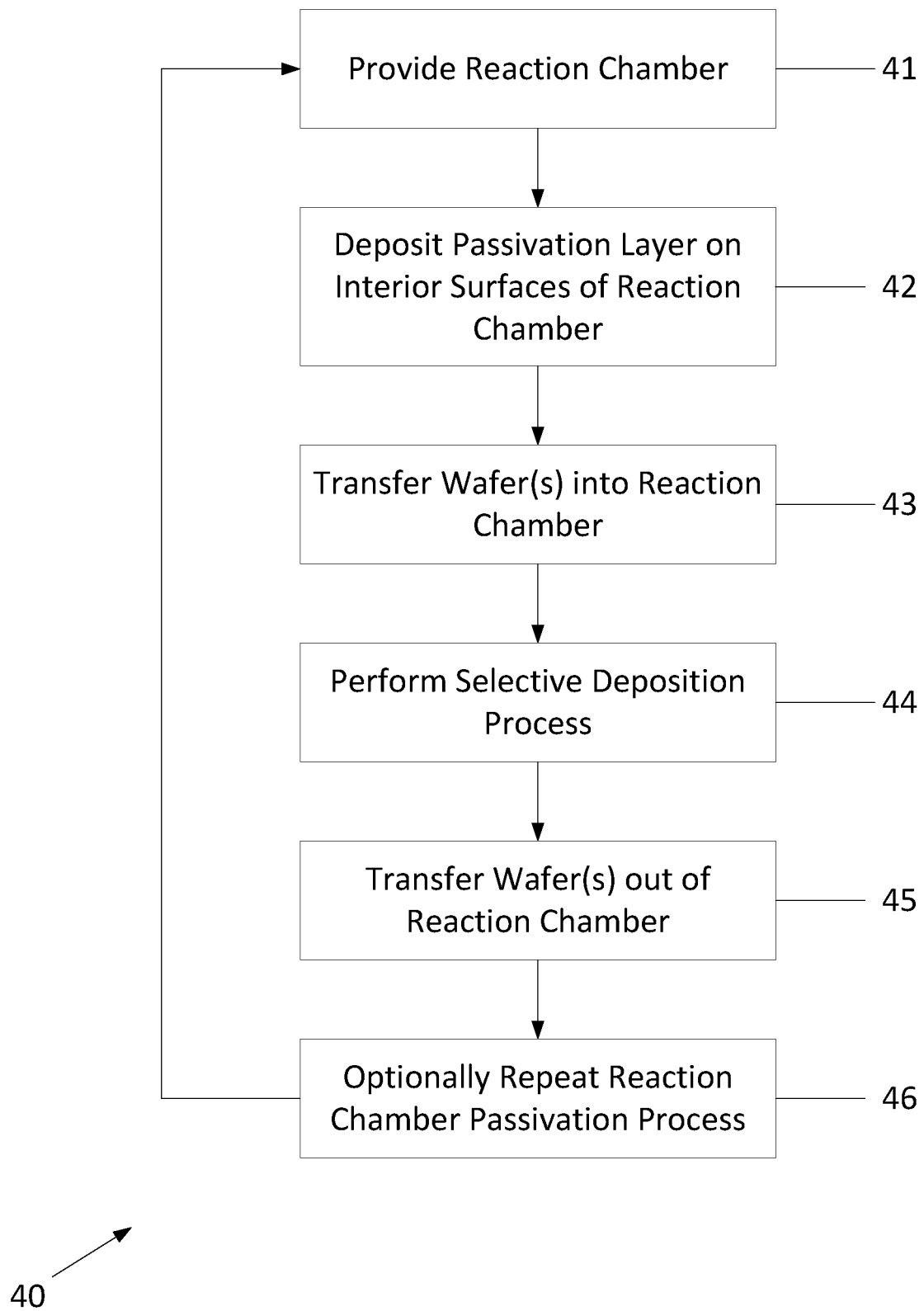
FIG. 4 is a flow chart generally illustrating a process for passivating a reaction chamber prior to performing a selective deposition process therein.

FIG. 4 is a flow chart generally showing an exemplary reaction chamber passivation process 40 in accordance with some embodiments. In some embodiments the reaction chamber passivation process may enable selective deposition, improve selectivity, and/or increase the number of cycles before selectivity is lost during a selective deposition process.

A reaction chamber in which a selective deposition process, for example a W selective deposition process, is to be performed is provided at step 41. The reaction chamber is provided with no wafers or substrates within. In some embodiments a selective deposition process may have been carried out on a wafer or wafers within the reaction chamber, which is then removed at step 41 so that there is no wafer within the reaction chamber. In some embodiments a wafer or wafers which will be subjected to a selective deposition process in the reaction chamber may be subjected to other processing before, during, or after the reaction chamber passivation process. For example a wafer may be subjected to a surface first surface treatment process in a second, different reaction chamber during the reaction chamber passivation process.

In some embodiments a passivation layer is deposited or formed at step 42 on the interior surfaces of the reaction chamber and any other locations which may be exposed to a precursor or reactant during a selective deposition process. In some embodiments the passivation layer is deposited or formed on the interior surface of the reaction chamber, the chamber showerhead, and/or any other parts of the chamber which may connect to the space where a selective deposition process will occur. In some embodiments the passivation layer may be deposited on any surface in the reaction chamber that is not a substrate.

In some embodiments the passivation layer, for example a layer of SiN, may be formed by a vapor deposition process, for example a PEALD process. In some embodiments the SiN layer may be formed by a process comprising one or more passivation layer deposition cycles comprising alternately and sequentially exposing the reaction chamber to a first silicon precursor and second nitrogen precursor. The passivation layer deposition cycle may optionally be repeated until a SiN passivation layer of a desired thickness has been formed.

In some embodiments the silicon precursor used in the passivation layer deposition process may comprise a silane, for example disilane. In some embodiments the nitrogen precursor may atomic nitrogen, nitrogen radicals, nitrogen plasma, or combinations thereof. In some embodiments the nitrogen precursor may further comprise atomic hydrogen, hydrogen radicals, hydrogen plasma, or combinations thereof. In some embodiments the nitrogen precursor may comprise plasma generated from $N_2$. In some embodiments the nitrogen precursor may comprise a plasma generated from $N_2$ and $H_2$ In some embodiments the nitrogen precursor may comprise plasma generated from $N_2$ and a noble gas, for example argon. In some embodiments the nitrogen precursor may comprise plasma generated from $N_2$, $H_2$, and a noble gas, for example argon.

In some embodiments, subsequent to formation of the passivation layer at step 42, a wafer or wafers are transferred into the reaction chamber at step 43. A selective deposition process, for example a W selective deposition process and any other desired processes may then be performed at step 44. In some embodiments, subsequent to the selective deposition process any wafer or wafers present in the reaction chamber may then be transferred out of the reaction chamber at step 45. In some embodiments the reaction chamber passivation process may optionally be repeated at step 46. In some embodiments a wafer or wafers may be transferred into the reaction chamber and another selective deposition process may be carried out again prior to optionally repeating the reaction chamber passivation process. That is, in some embodiments the reaction chamber passivation process may be repeated after every 1, 5, 10, 20, 50, or more wafers have been subjected to a selective deposition process. In some embodiments the reaction chamber passivation process may be repeated after a certain number of cycles of a selective deposition process have been performed. In some embodiments the reaction chamber passivation process may be repeated after every 50, 100, 150, or more selective deposition cycles.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A process for depositing a thin film on a substrate selectively, the process comprising:
    passivating an interior surface of a reaction chamber by a first vapor deposition process while the reaction chamber does not contain the substrate, wherein the first vapor deposition process comprises one or more deposition cycles in which the interior surface of the reaction chamber is contacted with a first vapor-phase precursor and a second vapor-phase precursor;
    selectively depositing a thin film on the substrate in the passivated reaction chamber by a second vapor deposition process comprising one or more selective deposition cycles; and
    repeating passivating the interior surface of the reaction chamber after two or more selective deposition cycles have been performed.

2. The process of claim 1, wherein passivating is repeated after every 50 or more selective deposition cycles.

3. The process of claim 1, further comprising subjecting the interior surface of the reaction chamber to an etch process prior to passivating the interior surface of the reaction chamber.

4. The process of claim 1, wherein the first vapor deposition process is an atomic layer deposition (ALD) process, a chemical vapor deposition (CVD) process, a plasma enhanced atomic layer deposition (PEALD) process or a plasma enhanced chemical vapor deposition (PECVD) process.

5. The process of claim 1, wherein the first vapor-phase precursor is a silicon precursor and the second vapor-phase precursor is a nitrogen precursor.

6. The process of claim 5, wherein the first vapor-phase precursor comprises disilane and the second vapor-phase precursor comprises one or more of atomic nitrogen, nitrogen radicals, and nitrogen plasma and one or more of atomic hydrogen, hydrogen radicals and hydrogen plasma.

7. The process of claim 1, wherein passivating comprises depositing SiN on the interior surface of the reaction chamber.

8. The process of claim 1, wherein passivating comprises depositing a passivation layer that does not comprise pure metal or pure silicon.

9. The process of claim 8, wherein the passivation layer comprises metal oxide.

10. The process of claim 9, wherein the metal oxide comprises tungsten.

11. The process of claim 1, additionally comprising subjecting the substrate to a first surface treatment process prior to selectively depositing the thin film on the substrate.

12. The process of claim 11, wherein the substrate comprises a first metallic surface and a second surface comprising silicon.

13. The process of claim 12, wherein the first surface treatment process removes organic material present on the first metallic surface.

14. The process of claim 12, wherein the first surface treatment process removes a passivation layer present on the first metallic surface.

15. The process of claim 12 wherein the thin film is selectively deposited on the first metallic surface of the substrate relative to the second surface of the substrate.

16. The process of claim 11, wherein the first surface treatment process comprises exposing the substrate to a plasma.

17. The process of claim 11, wherein the first surface treatment process comprises exposing the substrate to a treatment reactant comprising formic acid or an alcohol.

18. The process of claim 1, further wherein the selective deposition cycle comprises contacting the substrate with a first precursor comprising silicon or born.

19. The process of claim 18, wherein a layer of first material comprising silicon or boron is formed on the first metallic surface relative to the second surface comprising silicon.

20. The process of claim 19, further comprising converting the first material on the first metallic surface to a second metallic material by exposing the first material to a second precursor comprising metal.

* * * * *